(12) United States Patent
Cho et al.

(10) Patent No.: US 11,508,751 B2
(45) Date of Patent: *Nov. 22, 2022

(54) SEMICONDUCTOR DEVICE

(71) Applicant: Samsung Electronics Co., Ltd., Suwon-si (KR)

(72) Inventors: Namkyu Edward Cho, Seongnam-si (KR); Seok Hoon Kim, Seongnam-si (KR); Myung Il Kang, Yongin-si (KR); Geo Myung Shin, Seoul (KR); Seung Hun Lee, Hwaseong-si (KR); Jeong Yun Lee, Yongin-si (KR); Min Hee Choi, Suwon-si (KR); Jeong Min Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 29 days.

This patent is subject to a terminal disclaimer.

(21) Appl. No.: 17/144,458

(22) Filed: Jan. 8, 2021

(65) Prior Publication Data

US 2021/0159246 A1    May 27, 2021

Related U.S. Application Data

(63) Continuation of application No. 16/272,265, filed on Feb. 11, 2019, now Pat. No. 10,930,668.

(30) Foreign Application Priority Data

Jul. 23, 2018  (KR) ........................ 10-2018-0085563

(51) Int. Cl.
*H01L 29/66* (2006.01)
*H01L 29/78* (2006.01)
(Continued)

(52) U.S. Cl.
CPC .. *H01L 27/11582* (2013.01); *H01L 21/76877* (2013.01); *H01L 29/66795* (2013.01); *H01L 29/66833* (2013.01); *H01L 29/785* (2013.01)

(58) Field of Classification Search
CPC .......... H01L 27/11553; H01L 27/1158; H01L 27/11582; H01L 27/0924; H01L 27/1104;
(Continued)

(56) References Cited

U.S. PATENT DOCUMENTS 7,300,837 B2 * 11/2007 Chen ................. H01L 29/66628
                                                                  438/269
8,853,773 B2   10/2014 Lee
(Continued)

*Primary Examiner* — Natalia A Gondarenko
(74) *Attorney, Agent, or Firm* — Harness, Dickey & Pierce, P.L.C.

(57) ABSTRACT

A semiconductor device includes an active fin on a substrate, a gate electrode and intersecting the active fin, gate spacer layers on both side walls of the gate electrode, and a source/drain region in a recess region of the active fin at at least one side of the gate electrode. The source/drain region may include a base layer in contact with the active fin, and having an inner end and an outer end opposing each other in the first direction on an inner sidewall of the recess region. The source/drain region may include a first layer on the base layer. The first layer may include germanium (Ge) having a concentration higher than a concentration of germanium (Ge) included in the base layer. The outer end of the base layer may contact the first layer, and may have a shape convex toward outside of the gate electrode on a plane.

20 Claims, 25 Drawing Sheets

(51) Int. Cl.
*H01L 27/11582* (2017.01)
*H01L 21/768* (2006.01)

(58) Field of Classification Search
CPC ... H01L 29/0865–0869; H01L 29/0882–0886; H01L 29/41758; H01L 29/66795; H01L 29/66636; H01L 29/66696; H01L 29/66727; H01L 29/66833; H01L 29/7848; H01L 29/785; H01L 29/7853; H01L 29/7854; H01L 29/0847; H01L 29/167; H01L 29/66803; H01L 29/41766; H01L 29/41783; H01L 2029/7858; H01L 21/02381; H01L 21/76877; H01L 21/823418; H01L 21/823814; H01L 21/823821
USPC .................. 257/288, 324, 336, 192, 401
See application file for complete search history.

(56) References Cited

U.S. PATENT DOCUMENTS

| | | | |
|---|---|---|---|
| 8,865,554 | B2 | 10/2014 | Doo |
| 8,901,537 | B2 * | 12/2014 | Murthy ............. H01L 21/76864 |
| | | | 438/303 |
| 9,362,303 | B2 | 6/2016 | Lee et al. |
| 9,570,567 | B1 * | 2/2017 | Chang ............... H01L 29/66553 |
| 9,576,975 | B2 | 2/2017 | Zhang et al. |
| 9,793,404 | B2 | 10/2017 | Sung et al. |
| 10,930,668 | B2 * | 2/2021 | Cho ................ H01L 21/823821 |
| 2013/0341701 | A1 | 12/2013 | Blomme et al. |
| 2016/0027918 | A1 | 1/2016 | Kim et al. |
| 2016/0087104 | A1 | 3/2016 | Lee et al. |
| 2016/0172496 | A1 | 6/2016 | Chang et al. |
| 2017/0062471 | A1 | 3/2017 | Son et al. |
| 2017/0294436 | A1 | 10/2017 | Chang et al. |

* cited by examiner

SEMICONDUCTOR DEVICE

CROSS-REFERENCE TO RELATED APPLICATION(S)

This application is a continuation of U.S. application Ser. No. 16/272,265, filed Feb. 11, 2019, which claims benefit of priority to Korean Patent Application No. 10-2018-0085563 filed on Jul. 23, 2018 in the Korean Intellectual Property Office, the disclosure of each of which is incorporated herein by reference in its entirety.

BACKGROUND

1. Field

Inventive concepts relate to a semiconductor device.

2. Description of Related Art

As demand for high performance, high speed, and/or multifunctionality in semiconductor devices increases, a degree of integration of semiconductor devices has increased. When a semiconductor device corresponding to a high integration trend of a semiconductor device is manufactured, the semiconductor device may include patterns having a fine width or a fine separation distance. Moreover, in order to adjust for operation characteristics due to a reduction in a size of a planar metal oxide semiconductor FET (MOSFET), a semiconductor device including a Fin-FET having a channel with a three-dimensional structure has been developed.

SUMMARY

An aspect of inventive concepts is to provide a semiconductor device having improved electrical characteristics.

According to an aspect of inventive concepts, a semiconductor device includes: a substrate; an active fin on the substrate, the active fin extending in a first direction, the active fin including a recess region; a gate electrode on the substrate, the gate intersecting the active fin such that the recess region of the active fin is at at least one side of the gate electrode, the gate electrode extending in a second direction, the gate electrode including side walls; gate spacer layers on the side walls of the gate electrode; and a source/drain region the recess region of the active fin. The source/drain region may include a base layer in contact with the active fin and a first layer on the base layer. The base layer may include an inner end and an outer end opposing each other in the first direction. The base layer may be on an inner sidewall of the recess region. The first layer may include germanium (Ge) having a concentration higher than a concentration of germanium (Ge) included in the base layer, and the outer end of the base layer may be in contact with the first layer. The outer end of the base layer may have a shape convex toward outside of the gate electrode on a plane.

According to an aspect of inventive concepts, a semiconductor device includes: a substrate; an active fin on the substrate, the active fin extending in one direction on the substrate, the active fin including a recess region; a gate electrode on the substrate, the gate electrode extending and intersecting the active fin such that the recess region of the active fin is at at least one side of the gate electrode; and a source/drain region in the recess region of the active fin. The source/drain region may include a first layer and a second layer having different concentrations of germanium (Ge). An end portion of the first layer, in which the first layer may be in contact with the second layer on an inner sidewall of the recess region, may have a region convex toward outside of the gate electrode on a plane.

According to an aspect of inventive concepts, a semiconductor device includes: a substrate; an active fin on the substrate, the active fin extending in one direction on the substrate, the active fin including a recess region; a gate electrode on the substrate, the gate electrode extending and intersecting the active fin such that the recess region of the active fin is at at least one side of the gate electrode; and an epitaxial layer in the recess region of the active fin. At least one of an end portion of the active fin or an end portion of the epitaxial layer may have a region convex toward outside of the gate electrode on a plane. The end portion of the active fin may be defined by the recess region in at least one side of the gate electrode.

BRIEF DESCRIPTION OF DRAWINGS

The above and other aspects, features and other effects of inventive concepts will be more clearly understood from the following detailed description, taken in conjunction with the accompanying drawings, in which.

DETAILED DESCRIPTION

Hereinafter, example embodiments of inventive concepts will be described in detail with reference to the attached drawings.

Figure 1:
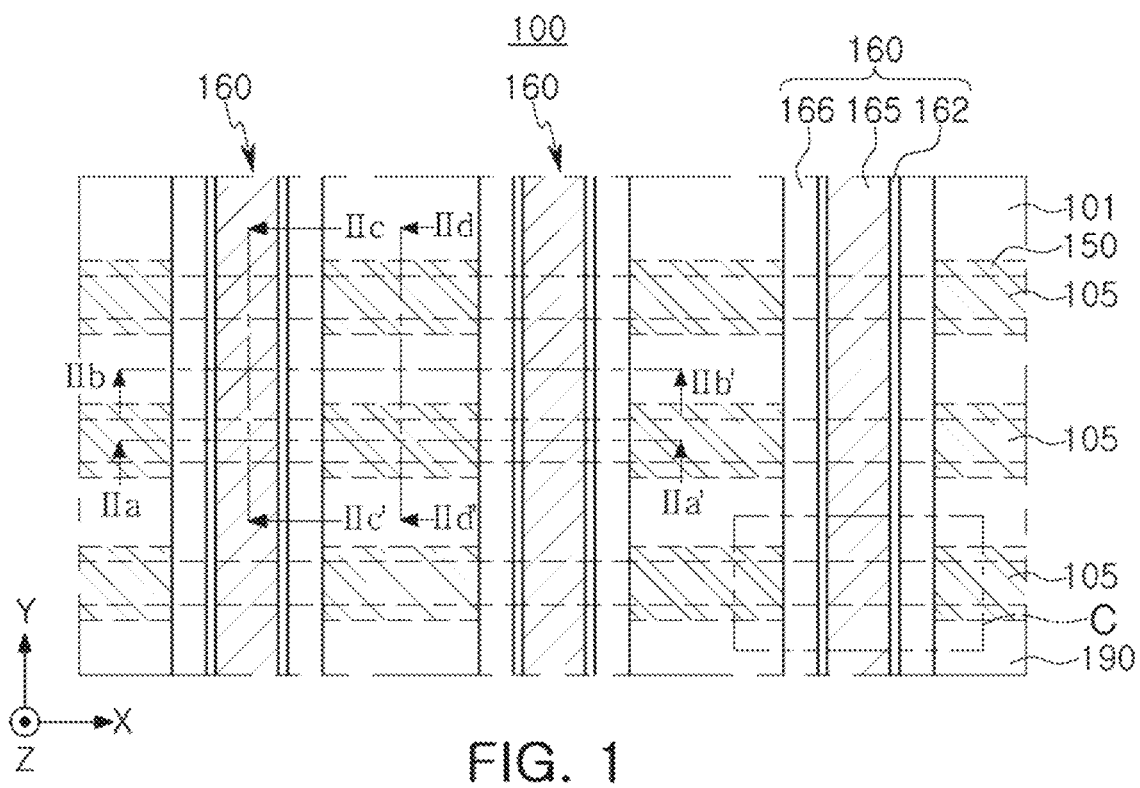
FIG. 1 is a plan view illustrating a semiconductor device according to example embodiments.

FIG. 1 is a plan view illustrating a semiconductor device according to example embodiments.

Figure 2A:
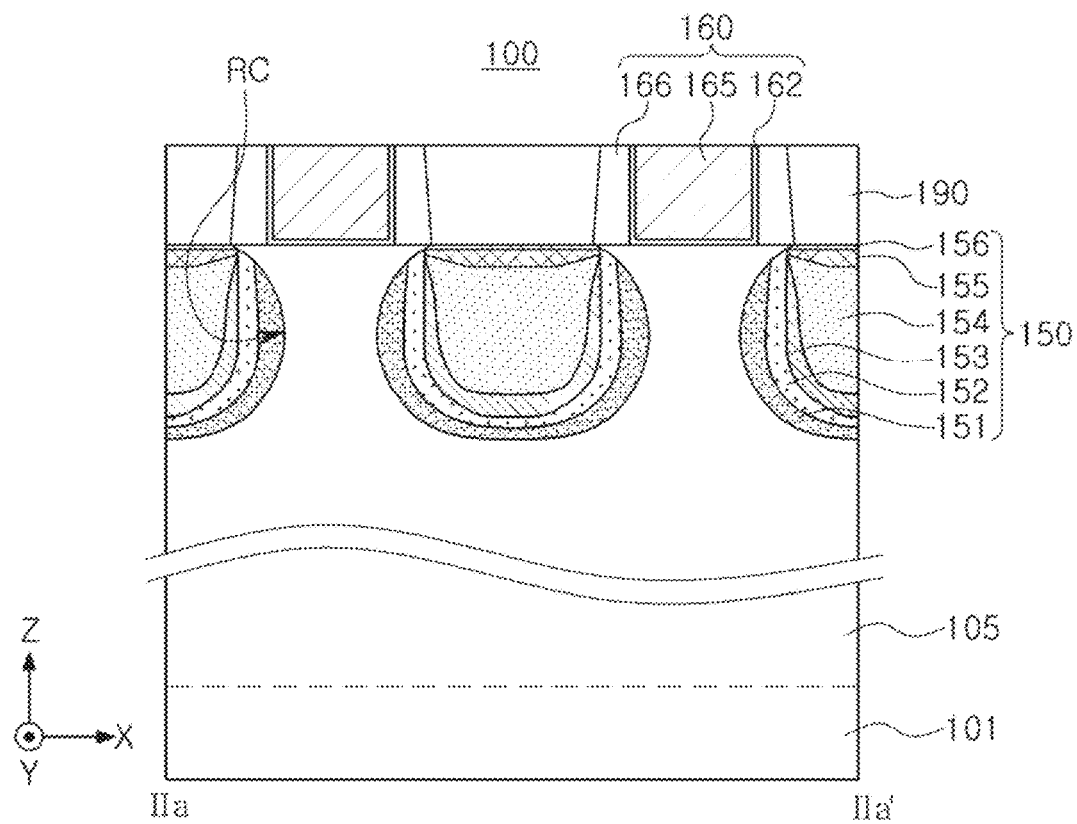
FIGS. 2A to 2D are cross-sectional views illustrating a semiconductor device according to example embodiments.
Figure 2B:
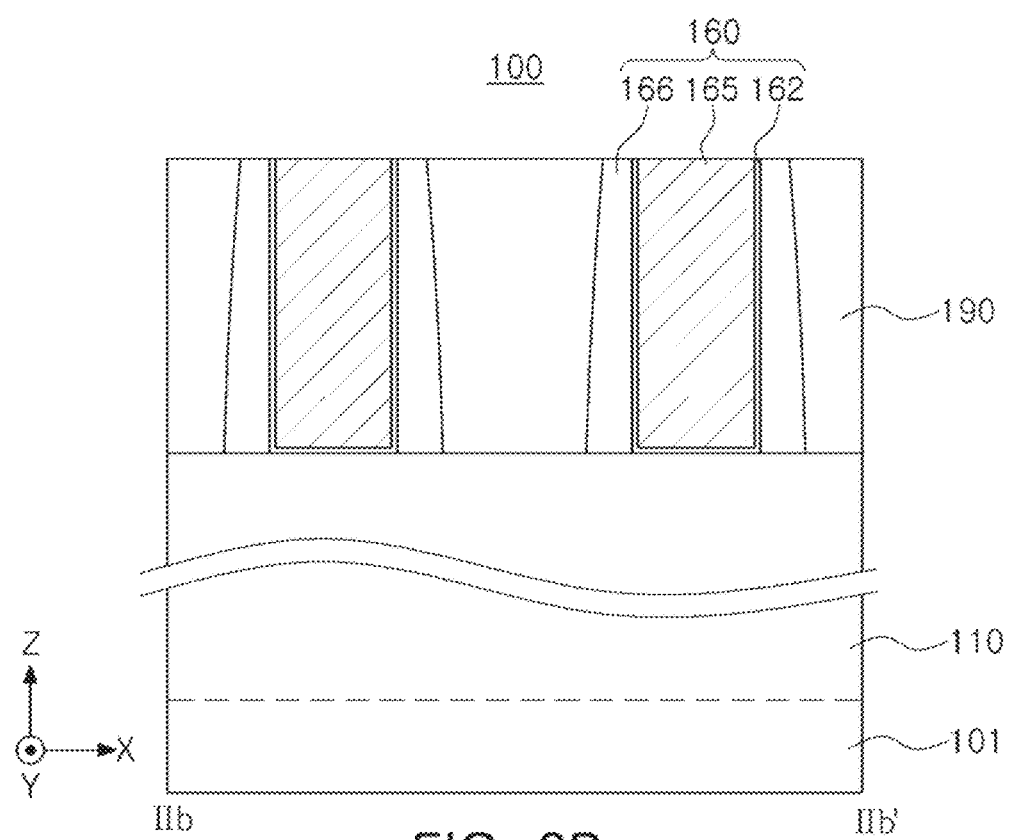
Figure 2C:
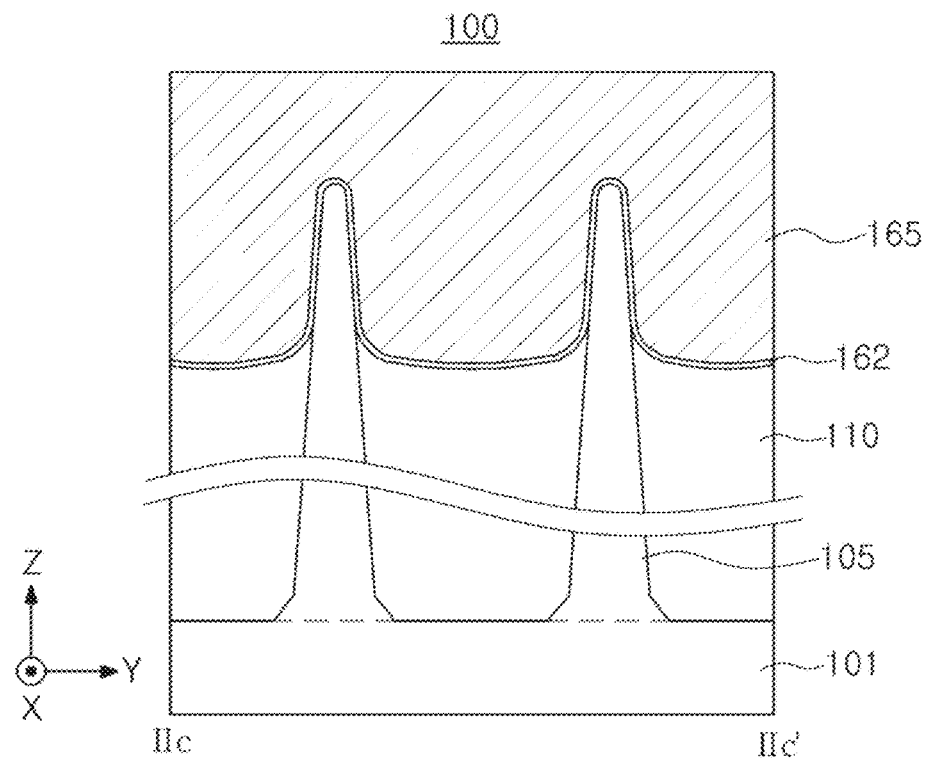
Figure 2D:
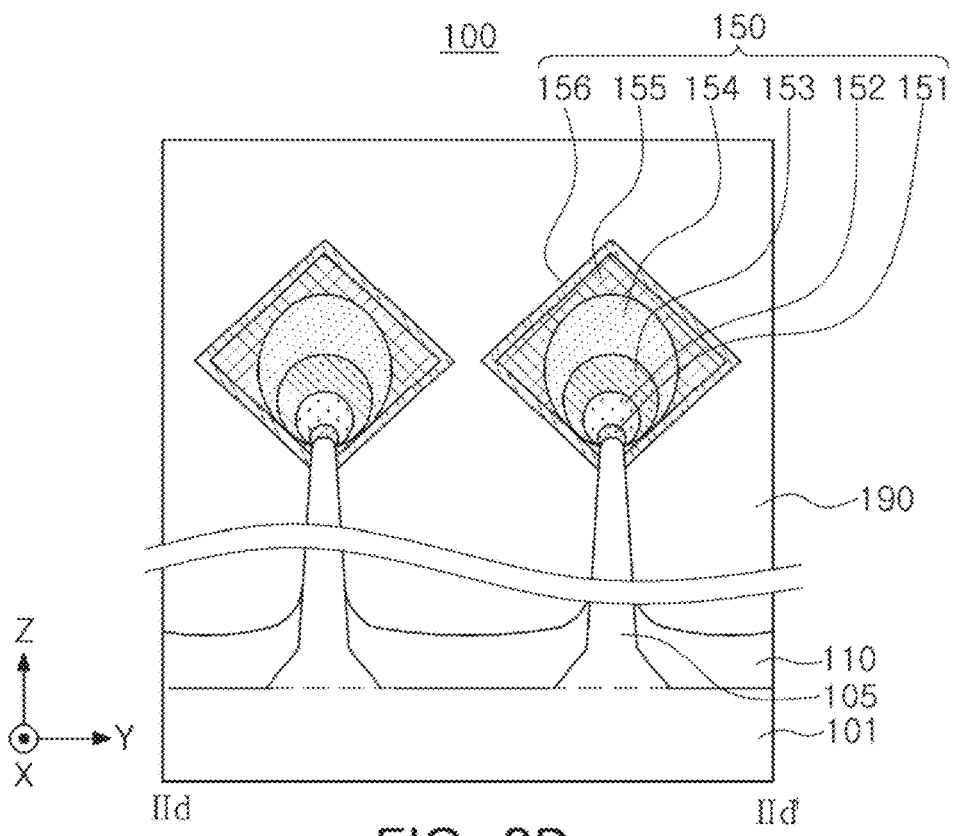

FIGS. 2A to 2D are cross-sectional views illustrating a semiconductor device according to example embodiments. FIGS. 2A to 2D illustrate a cross-section of the semiconductor device of FIG. 1, taken along lines IIa-IIa', IIb-IIb', IIc-IIc', and IId-II-d'. For convenience of explanation, only some components of a semiconductor device are illustrated in FIGS. 1 to 2D.

Referring to FIGS. 1 to 2D, a semiconductor device 100 may include a substrate 101, active fins 105, element isolation layers 110, source/drain regions 150, a gate structure 160, and an interlayer insulating layer 190. The gate structure 160 may include a gate dielectric layer 162, a gate electrode 165, and gate spacer layers 166. The semiconductor device 100 may include FinFET elements, a transistor in which the active fins 105 have a fin structure. The FinFET elements may include transistors disposed based on positions of the active fins 105 and the gate structures 160, intersecting each other. For example, the transistors may be PMOS transistors.

The substrate 101 may have an upper surface extended in an X-direction and a Y-direction. The substrate 101 may include a semiconductor material, such as a Group IV semiconductor, a Group III-V compound semiconductor, or a Group II-VI compound semiconductor. For example, the Group IV semiconductor may include silicon, germanium, or silicon-germanium. The substrate 101 may be provided as a bulk wafer, an epitaxial layer, a Silicon-On-Insulator (SOI) layer, a Semiconductor-On-Insulator (SeOI) layer, or the like.

The element isolation layers 110 may define the active fins 105 in the substrate 101. The element isolation layers 110 may be formed using, for example, a shallow trench isolation (STI) process. According to example embodiments, the element isolation layers 110 may include a region extended deeper toward a lower portion of the substrate 101 between the active fins 105. The element isolation layers 110 may have a curved upper surface having a level becoming higher toward the active fins 105, but a shape of the upper surface of the element isolation layers 110 is not limited thereto. The element isolation layers 110 may be formed of an insulating material. The element isolation layers 110 may be, for example, an oxide, a nitride, or a combination thereof.

The active fins 105 may be defined by the element isolation layers 110 in the substrate 101, and may extend in a first direction, for example, the X-direction. The active fins 105 may have a structure of an active fin protruding from the substrate 101. An upper end of the active fins 105 may protrude from an upper surface of the element isolation layers 110 by a desired (and/or alternatively predetermined) amount. The active fins 105 may be formed of a portion of the substrate 101, and may include an epitaxial layer grown from the substrate 101. Meanwhile, a portion of the active fins 105 on the substrate 101 may be recessed in both sides of the gate structures 160, and source/drain regions 150 may be disposed on the recessed active fins 105. Thus, as can be seen by comparing FIGS. 2C and 2D, the active fins 105 may have a relatively high height below the gate structure 160. According to example embodiments, the active fins 105 may include impurities.

The source/drain regions 150 may be disposed on recess regions RC, in which each of active fins 105 is recessed, in and/or adjacent to both sides of the gate structures 160. The recess region RC is extended in an X-direction between the gate structures 160, and may have inner sidewalls, located at both ends in an X-direction, and a bottom surface between the inner sidewalls. The source/drain regions 150 may be provided as a source region or a drain region of transistors. An upper surface of the source/drain regions 150 may be located at a height level, the same as or similar to a lower surface of the gate structures 160, as illustrated in FIG. 2A. Meanwhile, a relative height of the source/drain regions 150 and the gate structures 160 may be variously changed according to example embodiments. For example, the source/drain regions 150 may have a form of an elevated source/drain, in which an upper surface is located higher than a lower surface of the gate structures 160, in detail, the gate electrodes 165.

The source/drain regions 150 may have a cross-section, taken in the Y-direction, with a pentagon or a similar shape, as illustrated in FIG. 2D. Meanwhile, in example embodiments, the source/drain regions 150 may have various shapes, for example, one among a polygon, a circle, and a rectangle. Moreover, the source/drain regions 150 may have a cross-section, taken in the X-direction, of a flat upper surface, as illustrated in FIG. 2A, and may have a circular shape, an elliptical shape, or a similar shape thereto, below the upper surface. Meanwhile, the shape described above may be variously changed in example embodiments according to a distance between adjacent gate structures 160, a height of the active fins 105, or the like.

The source/drain regions 150 may include a base layer 151 and first to fifth layers 152, 153, 154, 155, and 156, sequentially stacked in the recess region RC. The base layer 151 and the first to fifth layers 152, 153, 154, 155, and 156 may include silicon (Si), and may have different concentrations of germanium (Ge). Meanwhile, in example embodiments, the number of layers, forming the source/drain region 150, may be variously changed.

For example, the base layer 151 is only formed of silicon (Si), or may further include germanium (Ge). When the base layer 151 includes germanium (Ge), the concentration of germanium (Ge) may be lower than that of each of the first to fifth layers 152, 153, 154, 155, and 156, and may be higher than that of the active fin 105. For example, a concentration of germanium (Ge) in the base layer 151 may be equal to or less than 20 at. %. In this specification, a concentration of germanium (Ge) refers to an atomic concentration (an atomic percentage). The base layer 151 may further include doping elements such as boron (B) or gallium (Ga). In this case, the concentration of the doping elements may be lower than that of each of the first to fifth layers 152, 153, 154, 155, and 156, and may be higher than that of the active fin 105.

In the first to fourth layers 152, 153, 154, and 155, a concentration of germanium (Ge) may be increased upwardly. The first layer 152 includes germanium (Ge) having a first concentration, the second layer 153 includes germanium (Ge) having a second concentration, higher than the first concentration, the third layer 154 includes germanium (Ge) having a third concentration, higher than the second concentration, and the fourth layer 155 may include germanium (Ge) having a fourth concentration, higher than the third concentration. For example, the first concentration is in a range of 20 at. % to 40 at. %, the second concentration is in a range of 35 at. % to 55 at. %, the third concentration is in a range of 45 at. % to 65 at. %, and the fourth concentration is in a range of 50 at. % to 70 at. %. Moreover, in the first to fourth layers 152, 153, 154, and 155, a concentration of a doping element such as boron (B) or gallium (Ga) may be also increased upwardly. The fifth layer 156 may include germanium (Ge) having a concentration lower than that of the fourth layer 155, or may not include germanium (Ge). For example, the fifth layer 156 may be formed of silicon (Si), and may further include impurities other than silicon (Si), according to example embodiments.

The base layer 151 and the first to fifth layers 152, 153, 154, 155, and 156 may have the same thickness or different thicknesses. For example, the base layer 151 and the fifth layer 156 may have a relatively thin thickness, while the third layer 154 may be formed to be relatively thick. The base layer 151 may have a thickness, for example, in a range of 3 nm to 5 nm.

At least one region of the base layer 151 is located below the gate electrode 165, and at least one region of the first layer 152 may be located below the gate spacer layer 166. On a plane, the base layer 151 may have a region convex outwardly of the gate electrode 165. This will be described in more detail below with reference to FIGS. 3 to 4B.

The gate structure 160 may be disposed above the active fins 105 to be extended in one direction, for example, the Y-direction, while intersecting the active fins 105. A channel region of transistors may be provided in the active fins 105, intersecting the gate structure 160. The gate structure 160 may include a gate dielectric layer 162, a gate electrode 165, and gate spacer layers 166.

The gate dielectric layer 162 may be disposed between the active fins 105 and the gate electrodes 165, and may be disposed to cover a lower surface and both side surfaces of the gate electrodes 165. Alternatively, in some example embodiments, the gate dielectric layer 162 may be only formed on a lower surface of the gate electrode 165. The gate dielectric layer 162 may include an oxide, a nitride, or a high-k material. The high-k material may refer to a dielectric material having a dielectric constant, higher than a dielectric constant of a silicon oxide ($SiO_2$) film. The high-k material may be provided as one of an aluminum oxide ($Al_2O_3$), a tantalum oxide ($Ta_2O_3$), a titanium oxide ($TiO_2$), a yttrium oxide ($Y_2O_3$), a zirconium oxide ($ZrO_2$), a zirconium silicon oxide ($ZrSi_xO_y$), a hafnium oxide ($HfO_2$), a hafnium silicon oxide ($HfSi_xO_y$), a lanthanum oxide ($La_2O_3$), a lanthanum aluminum oxide ($LaAl_xO_y$), a lanthanum hafnium oxide ($LaHf_xO_y$), a hafnium aluminum oxide ($HfAl_xO_y$), and a praseodymium oxide ($Pr_2O_3$).

The gate electrode 165 may include a conductive material, and may include, for example, a metal nitride such as a titanium nitride film (TiN), a tantalum nitride film (TaN), or a tungsten nitride film (WN), and/or a metallic material such as aluminum (Al), tungsten (W), molybdenum (Mo), or the like, or a semiconductor material such as doped polysilicon. The gate electrodes 165 may include multilayer structures such as two or more layers. According to example embodiments, a capping layer may be further disposed above the gate electrode 165, and a lower surface and side surfaces of the capping layer may be surrounded by the gate electrode 165 and the gate spacer layers 166, respectively.

The gate spacer layers 166 may be disposed on both side surfaces of the gate electrode 165. The gate spacer layers 166 may allow the source/drain regions 150 to be isolated from the gate electrodes 165. The gate spacer layers 166 may have a multilayer structure according to example embodiments. The gate spacer layers 166 may be formed of at least one of an oxide, a nitride, or an oxynitride, in detail, a low-k film.

The interlayer insulating layer 190 may be disposed to cover upper surfaces of the element isolation layers 110, the source/drain regions 150, and the gate structures 160. The interlayer insulating layer 190 may include, for example, at least one among an oxide, a nitride, and an oxynitride, and may include a low-k material. A material of the interlayer insulating layer 190 may be different than a material of the gate spacer layer 160.

Figure 3:
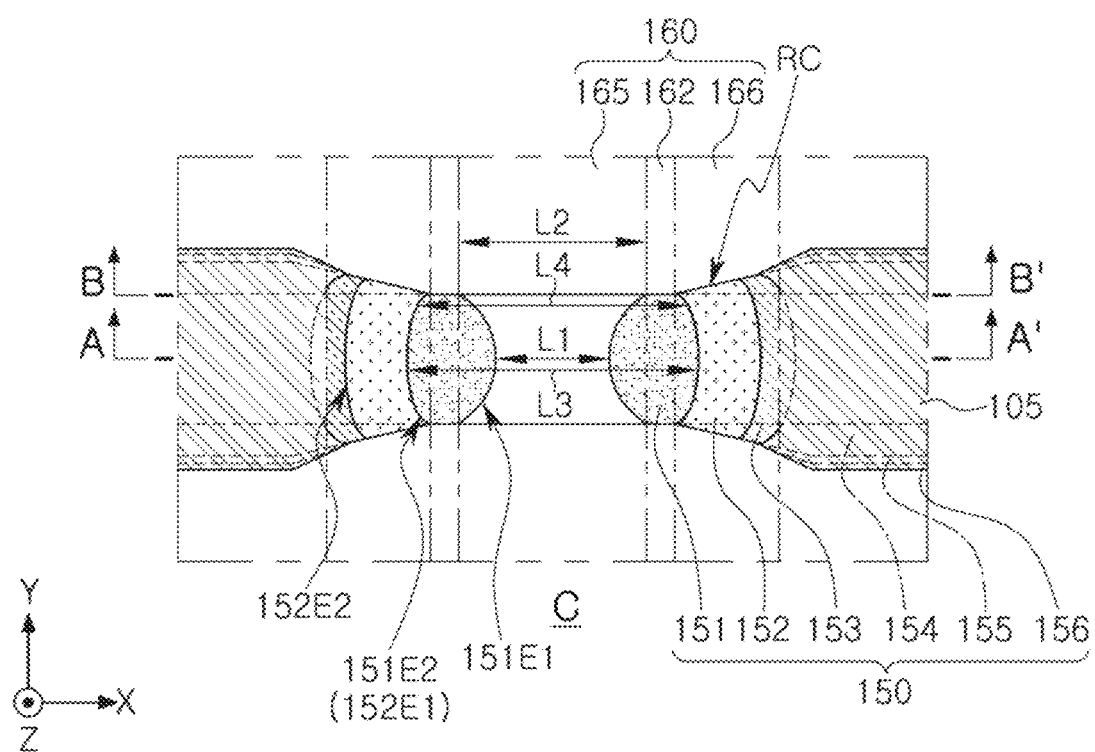
FIG. 3 is a partially enlarged plan view illustrating a semiconductor device according to example embodiments.

FIG. 3 is a partially enlarged plan view illustrating a semiconductor device according to example embodiments. In FIG. 3, a 'C' region of FIG. 1 is enlarged and illustrated.

Figure 4A:
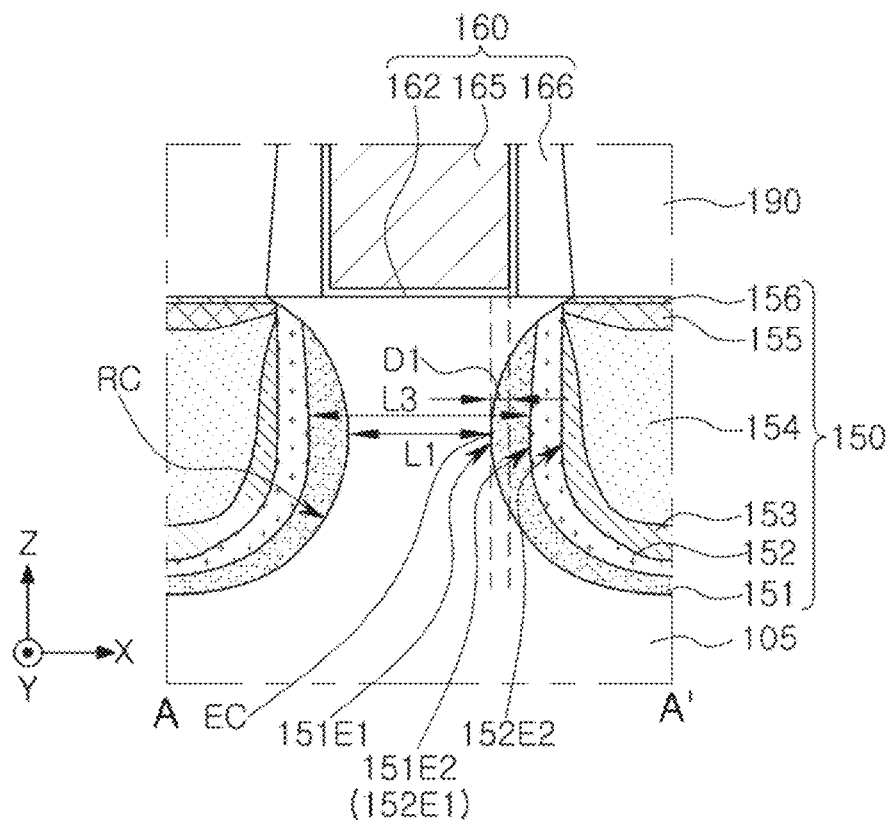
FIGS. 4A and 4B are cross-sectional views illustrating a portion of a semiconductor device according to example embodiments.
Figure 4B:
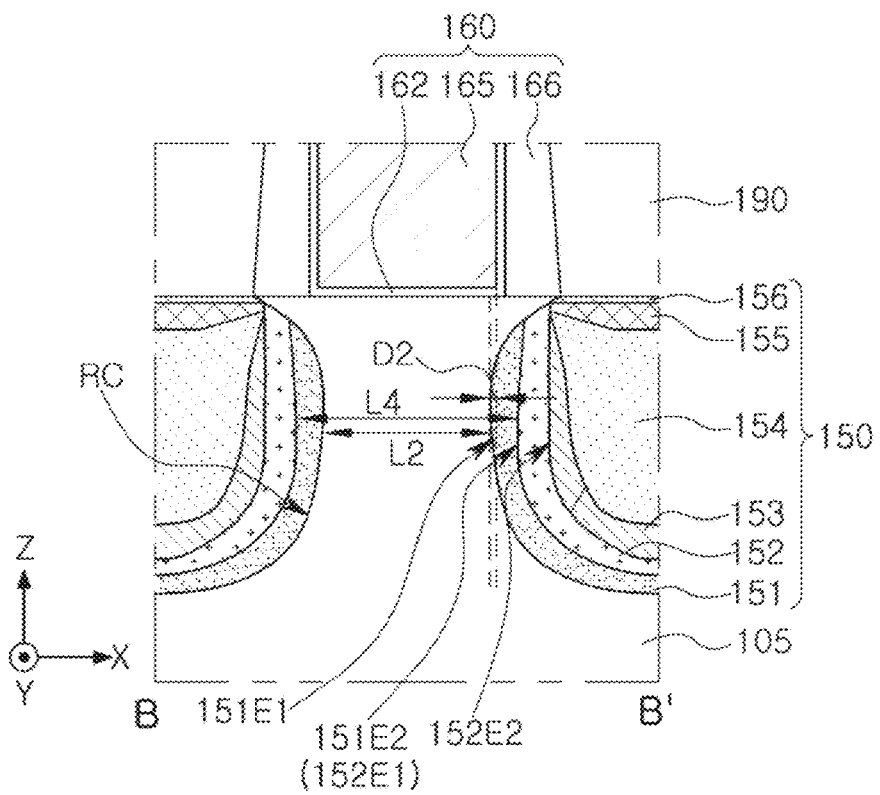

FIGS. 4A and 4B are cross-sectional views illustrating a portion of a semiconductor device according to example embodiments. FIGS. 4A and 4B illustrate a cross-section of the semiconductor device of FIG. 3, taken along lines A-A' and B-B', respectively.

First, referring to FIG. 3, an active fin 105, a source/drain region 150 disposed in a recess region RC of the active fin 105, and a gate structure 160 are illustrated. In detail, in FIG. 3, the arrangement on a plane, of the base layer 151 and the first to fifth layers 152, 153, 154, 155, and 156, forming the source/drain region 150, is illustrated in detail.

The recess region RC of the active fin 105 is formed to be extended downwardly of the gate structures 160 between the gate structure 160, and an end portion thereof in the X-direction may be located below the gate structure 160. The end portion of the recess region RC may have a shape concave outwardly of the gate structure 160. In other words, the end portion of the recess region RC may have a shape of which a width is increased from a lower portion of the gate structure 160 toward a side surface or a side wall of the gate structure 160.

The base layer 151 is disposed at a lowermost portion of the recess region RC, and may be disposed to be in contact with inner sidewalls and a bottom surface of the recess region RC. Thus, an inner end 151E1 of the base layer 151 may have a shape concave outwardly in a manner similar to the end portion of the recess region RC. In this specification, in the description of the source/drain regions 150, an 'end portion' is used as an expression referring to a point on an inner sidewall of the recess region RC, in contact with other vertical layers. Moreover, in the description of the end portion, a portion closer to the center based on the center of the gate structure 160 or the gate electrode 165 in the X-direction is referred to as an 'inner side,' and a portion remote from the center is referred to as an 'outer side.' An outer end 151E2 of the base layer 151 may have a shape convex outwardly of the gate structure 160 or the gate electrode 165. According to example embodiments, a portion of the outer end 151E2 of the base layer 151 may coincide with a crystal plane of the active fin 105. However, even in this case, surfaces, growing in the X-direction from the base layer 151, may not be formed of facets formed along a crystal plane, and facets may at least have a relaxed form. For example, when an upper surface of the substrate 101 or the active fin 105 is a <100> direction, the base layer 151 may not only be formed of facets such as a {111} facet in a <110> direction, corresponding to the X-direction.

The first layer 152 may be disposed on the base layer 151, and the inner end 152E1 of the first layer 152 may be substantially the same as the outer end 151E2 of the base layer 151. Thus, the inner end 152E1 of the first layer 152 may have a shape convex outwardly of the gate structure 160 or the gate electrode 165. The outer end 152E2 of the first layer 152 may also have a shape convex outwardly of the gate structure 160 or the gate electrode 165, and a surface in the X-direction may not be formed of facets. The first layer 152 is formed on the base layer 151, not having facets, and may thus not have facets. Thus, the uniformity of a thickness in the recess region RC may be improved. At least a portion of the base layer 151 and the first layer 152 may be disposed below the gate spacer layer 166 on a plane.

The second layer 153 may be disposed on the first layer 152, and may have an outer end with a shape convex toward an outer region of the gate electrodes 165. However, a position of the outer end is not limited thereto. A width of the second layer 153 in the Y-direction may be similar to or greater than that of the first layer 152. The third to fifth layers 154, 155, and 156 may be sequentially disposed on the second layer 153, and the relative positional relationship of the second to fifth layers 153, 154, 155, and 156 may be variously changed in example embodiments.

Referring to FIGS. 4A and 4B, in an inner end 151E1 of the base layer 151, an outermost portion EC illustrated in FIG. 4A, closest to the center of the gate electrode 165 in the X-direction, may be located below the gate electrode 165. Moreover, at least a portion of the first layer 152 may be located below the gate spacer layer 166. On an inner sidewall of the recess region RC, the inner end 151E1 of the base layer 151 and the inner end 152E1 of the first layer 152 may have a region extended perpendicularly to an upper surface of the substrate 101. Alternatively, on the inner sidewall of the recess region RC, an inner side surface of the base layer 151 and an inner side surface of the first layer 152 may have a region extended perpendicularly to the upper surface of the substrate 101.

A length L1 of the active fin 105 in the center of the active fin 105 in the Y-direction, illustrated in FIG. 4A, may be shorter than a length L2 of an active fin in an edge, illustrated in FIG. 4B. A separation distance D1 between a side surface of the gate electrode 165 and an outermost portion EC of the base layer 151 in the center of the active fin 105 in the Y-direction between the source/drain regions 150 may be greater than a separation distance D2 in an edge. Moreover, a length L3 between outer ends 151E2 of both base layers 151 of the gate electrode 165, in the center of the active fin 105 in the Y-direction, illustrated in FIGS. 3 and 4A, may be greater than a length L4 between outer ends 151E2 in an edge, illustrated in FIGS. 3 and 4B.

At least a portion the second to fifth layers 153, 154, 155, and 156 may be located below the gate spacer layer 166, but is not limited thereto. Each of the base layer 151 as well as the first layer 152 and the second layer 153 may have a uniform thickness in the recess region RC, or may have a different thickness according to a region. The third layer 154 may have a relatively thick thickness as compared with other layers. The fourth 155 and the fifth layer 156 may be disposed in a region adjacent to an upper surface of the source/drain region 150, and may have a relatively thin thickness as compared with other layers.

The first layer 152 does not have a facet. Thus, upper layers including the second layer 153 formed above the first layer 152 may have improved uniformity of a thickness, as compared with the case in which it is formed above facets. When the first layer 152 has facets, the second layer 153 may be formed relatively thicker on a bottom surface of the recess region RC. However, according to example embodiments, in the second layer 153, a thickness on a side wall of the active fin 105 may not be significantly different from a thickness on a bottom surface of the recess region RC, and may be substantially uniform.

The first to third layers 152, 153, and 154 may serve to apply stress to a channel region of a transistor. Thus, according to example embodiments, layers including the first layer 152 and the second layer 153 are formed to have a uniform thickness, and an inner side surface of the base layer 151 and an inner side surface of the first layer 152 have a region perpendicular to an upper surface of the substrate 101. Thus, stress is uniformly transferred to a channel region, so electrical characteristics of a semiconductor device such as resistance of a channel region, drain induced barrier lowering (DIBL) characteristics, and the like, may be improved. Moreover, as compared to the case in which it is formed above facets, for example, a volume of the third layer 154 may be relatively increased. When the third layer 154 functions as a main layer for applying stress to a channel region, if the volume of the third layer 154 is increased, stress may be sufficiently applied to the channel region.

FIGS. 5A to 6B are plan views and cross-sectional views illustrating a semiconductor device according to example embodiments. In FIGS. 5A to 6B, regions corresponding to those of the FIGS. 3 and 4A are illustrated.

Figure 5A:
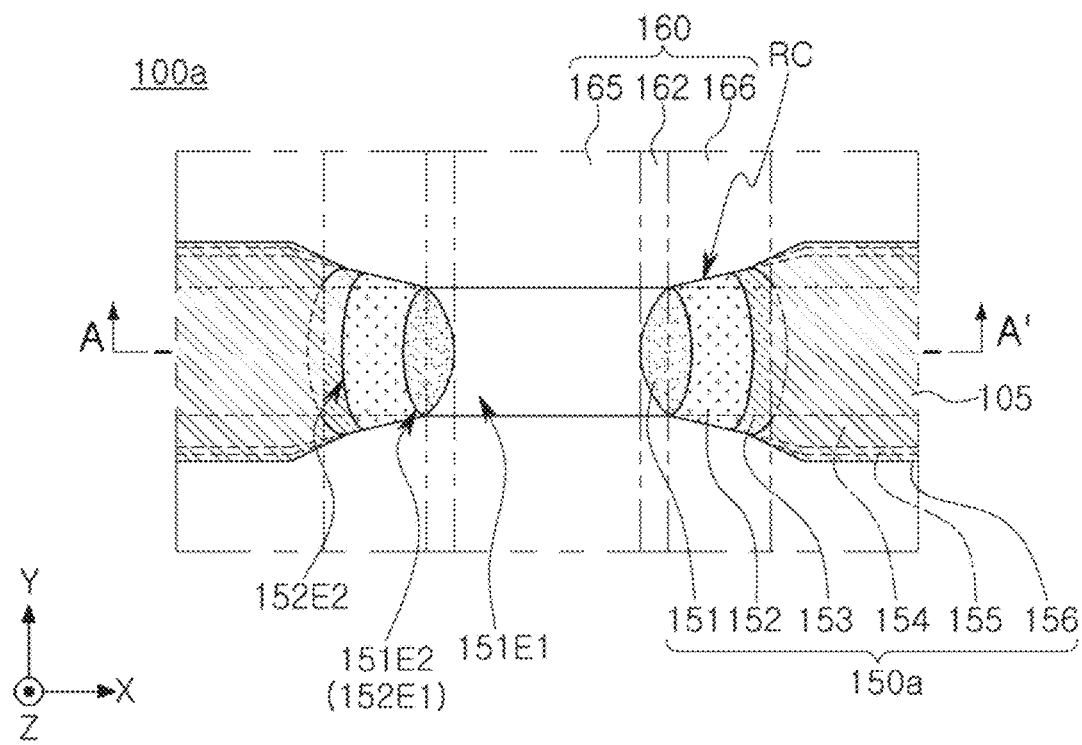
FIGS. 5A to 6B are plan views and cross-sectional views illustrating a semiconductor device according to example embodiments.
Figure 5B:
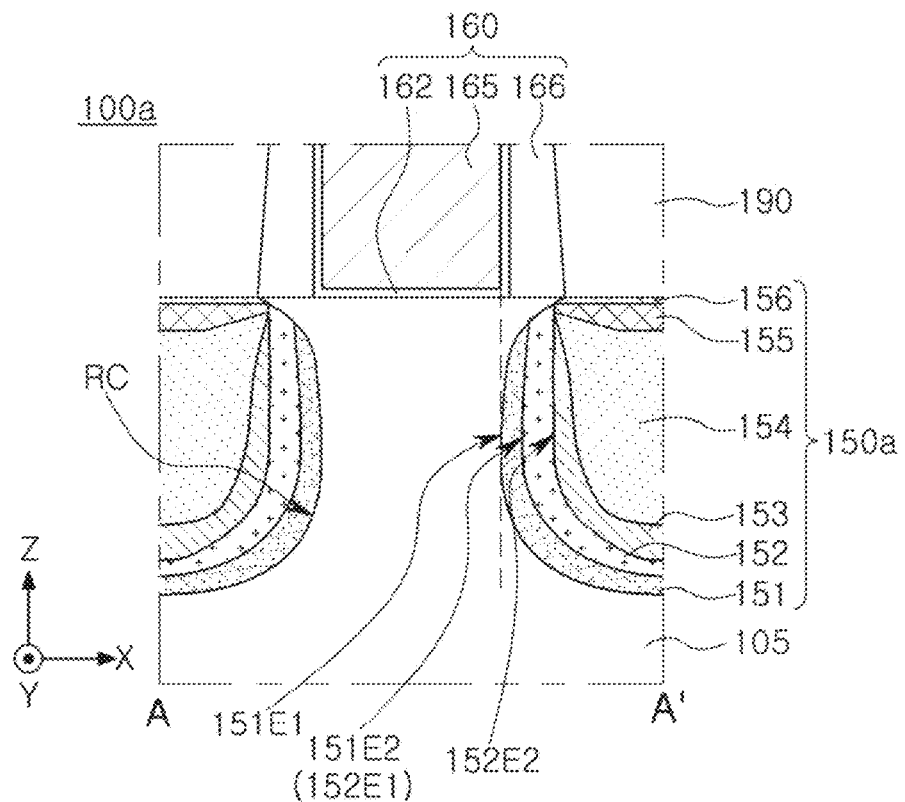

Referring to FIGS. 5A and 5B, in a source/drain region 150a of a semiconductor device 100a, an outermost portion EC of a base layer 151 may be located below an interface between the gate electrode 165 and the gate dielectric layer 162 or outside thereof. For example, the outermost portion EC of the base layer 151 may be located below the gate dielectric layer 162. At least a portion of the first layer 152 may be located below the gate spacer layer 166. At least a portion the second to fifth layers 153, 154, 155, and 156 may be located below the gate spacer layer 166, but is not limited thereto. In example embodiments, the third to fifth layers 154, 155, and 156 may not be located below the gate spacer layer 166.

Figure 6A:
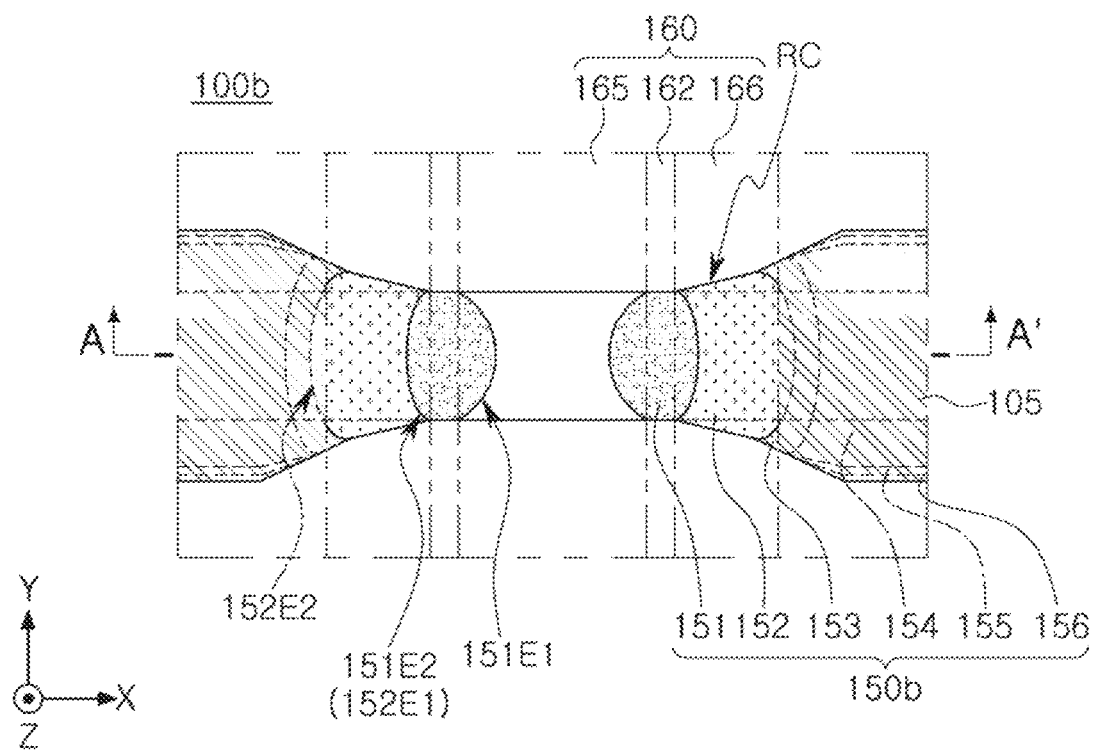
Figure 6B:
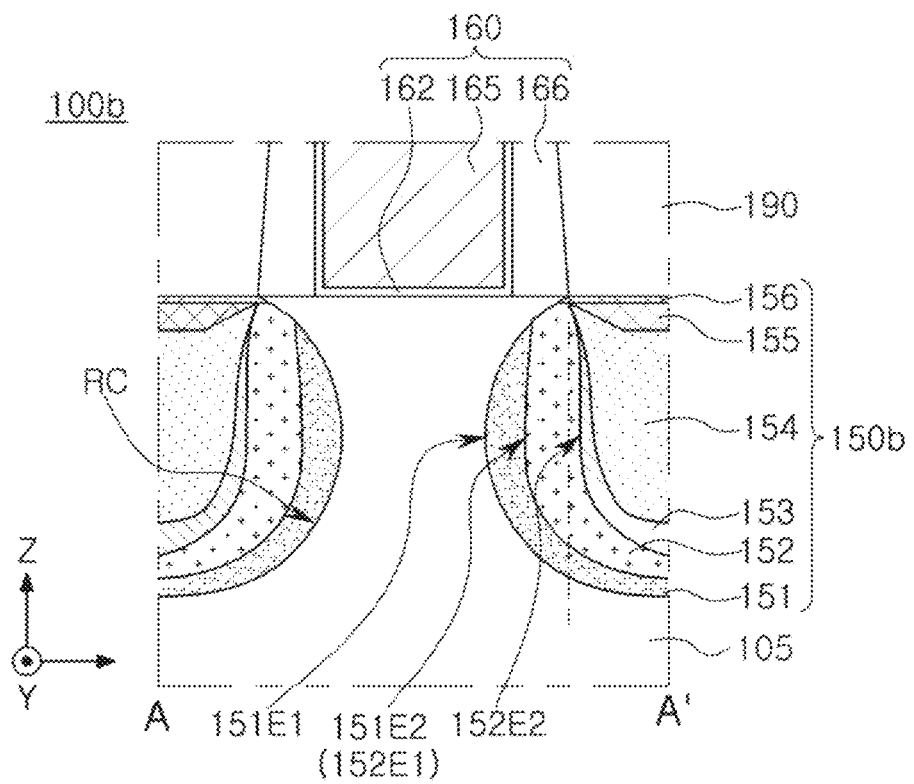

Referring to FIGS. 6A and 6B, in a source/drain region 150b of a semiconductor device 100b, a first layer 152 may include a region located outside of a lower portion of a gate spacer layer 166 on a side wall of an active fin 105. In other words, an outer end 152E2 of the first layer 152 may be located externally as compared with the gate spacer layer 166 on a plane. Thus, the second to fifth layers 153, 154, 155, and 156 may not be located below the gate spacer layer 166 on a side wall of the active fin 105.

In a manner similar to that described with reference to FIGS. 5A to 6B, in example embodiments, a position of the inner end 151E1 of the base layer 151, a position of an inner end 152E1 and an outer end 152E2 of a first layer 152, and the like may be variously changed.

Figure 7A:
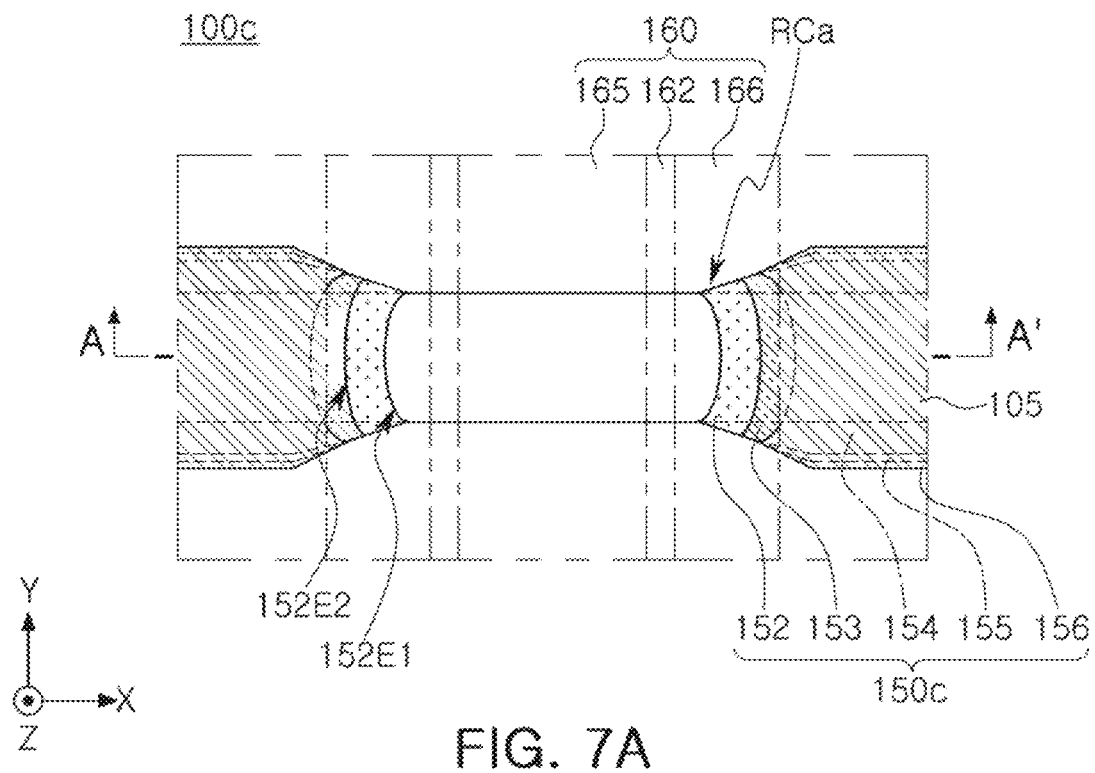
FIGS. 7A and 7B are a plan view and a cross-sectional view illustrating a semiconductor device according to example embodiments.
Figure 7B:
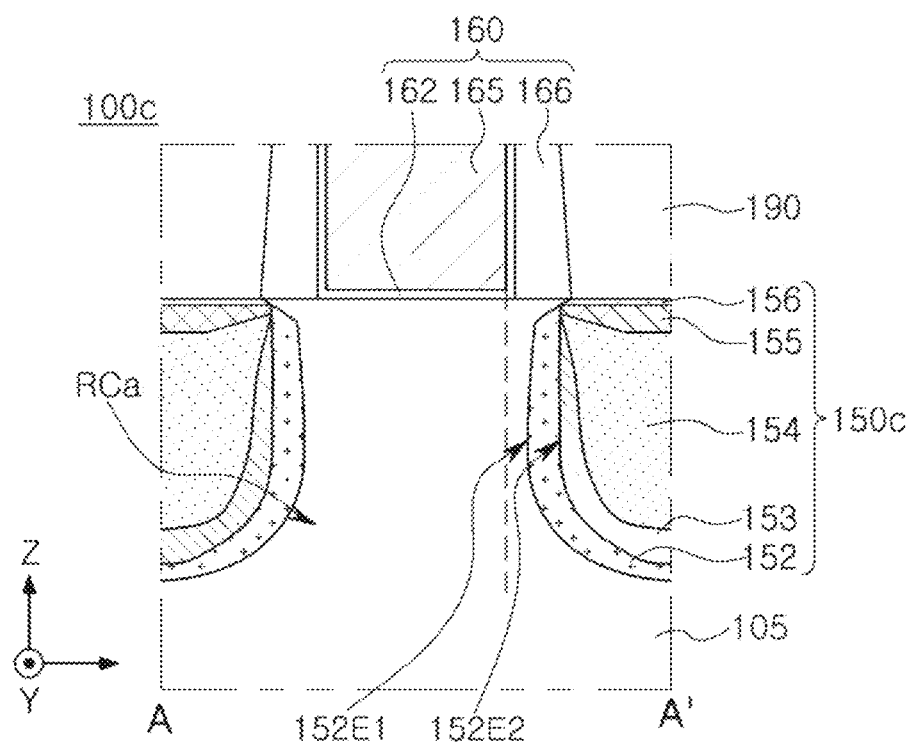

FIGS. 7A and 7B are a plan view and a cross-sectional view illustrating a semiconductor device according to example embodiments. In FIGS. 7A to 7B, regions corresponding to those of the FIGS. 3 and 4A are illustrated.

Referring to FIGS. 7A and 7B, a source/drain region 150c of a semiconductor device 100c, in a manner different from the example embodiment of FIGS. 1 to 4B, may not include a base layer 151. The source/drain region 150c may be formed of first to fifth layers 152, 153, 154 155, and 156. Moreover, an end portion of a recess region RCa of the active fin 105 may have a shape convex outwardly of the gate structure 160 on a plane. In other words, the end portion of the recess region RCa may have a shape of which a width is decreased toward a side wall of the gate structure 160. As described above, when the end portion of the recess region RCa has a shape convex outwardly of the gate structure 160, even though the source/drain region 150c does not include the base layer 151, electrical characteristics of the semiconductor device 100c may be secured.

The first layer 152 may be disposed in the recess region RCa to be in contact with the active fin 105. At least a portion of the first layer 152 may be located below the gate spacer layer 166. However, a position of the first layer 152 is not limited thereto. For example, in example embodiments, the first layer 152 may be located below the gate electrode 165. An inner end 152E1 and an outer end 152E2 of the first layer 152 may have a shape convex outwardly of the gate structure 160 or the gate electrode 165. End portions of the second layer 153 may have a shape convex outwardly.

Figure 8:
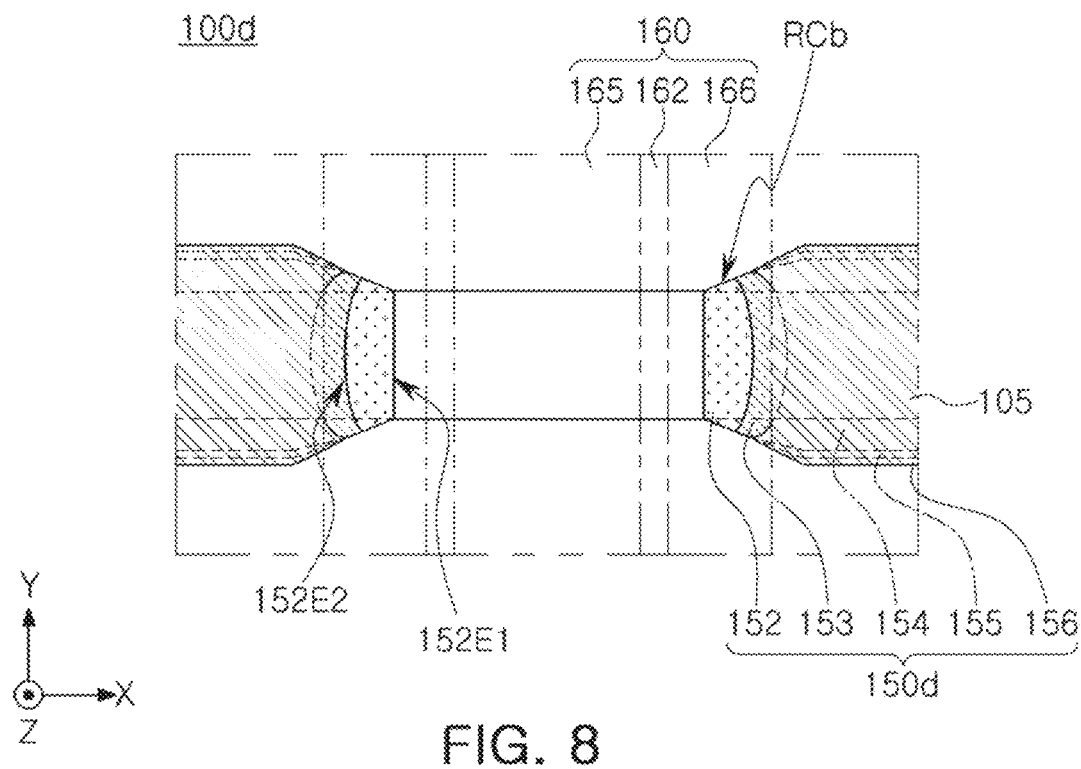
FIG. 8 is a plan view illustrating a semiconductor device according to example embodiments.

FIG. 8 is a plan view illustrating a semiconductor device according to example embodiments. In FIG. 8, a region corresponding to that of FIG. 3 is illustrated.

Referring to FIG. 8, a source/drain region 150*d* of a semiconductor device 100*d*, in a manner different from the example embodiment of FIGS. 1 to 4B, may not include a base layer 151. The source/drain region 150*d* may be formed of first to fifth layers 152, 153, 154 155, and 156. Moreover, an end portion of a recess region RCb of an active fin 105 may have a shape substantially parallel to a side wall of a gate structure 160 on a plane. As described above, when the end portion of the recess region RCa has a shape extended to be flat in the Y-direction of the gate structure 160, even though the source/drain region 150*d* does not include the base layer 151, electrical characteristics of the semiconductor device 100*d* may be secured.

The first layer 152 may be disposed in the recess region RCb to be in contact with the active fin 105. At least a portion of the first layer 152 may be located below the gate spacer layer 166. However, a position of the first layer 152 is not limited thereto. For example, in example embodiments, the first layer 152 may be located below the gate electrode 165. The inner end 152E1 of the first layer 152 may have a linear shape substantially parallel to a side wall of the gate structure 160. An outer end 152E2 of the first layer 152 may have a shape convex outwardly of the gate structure 160 or the gate electrode 165. However, according to example embodiments, the outer end 152E2 of the first layer 152 may have a linear shape substantially parallel to a side wall of the gate structure 160.

Figure 9A:
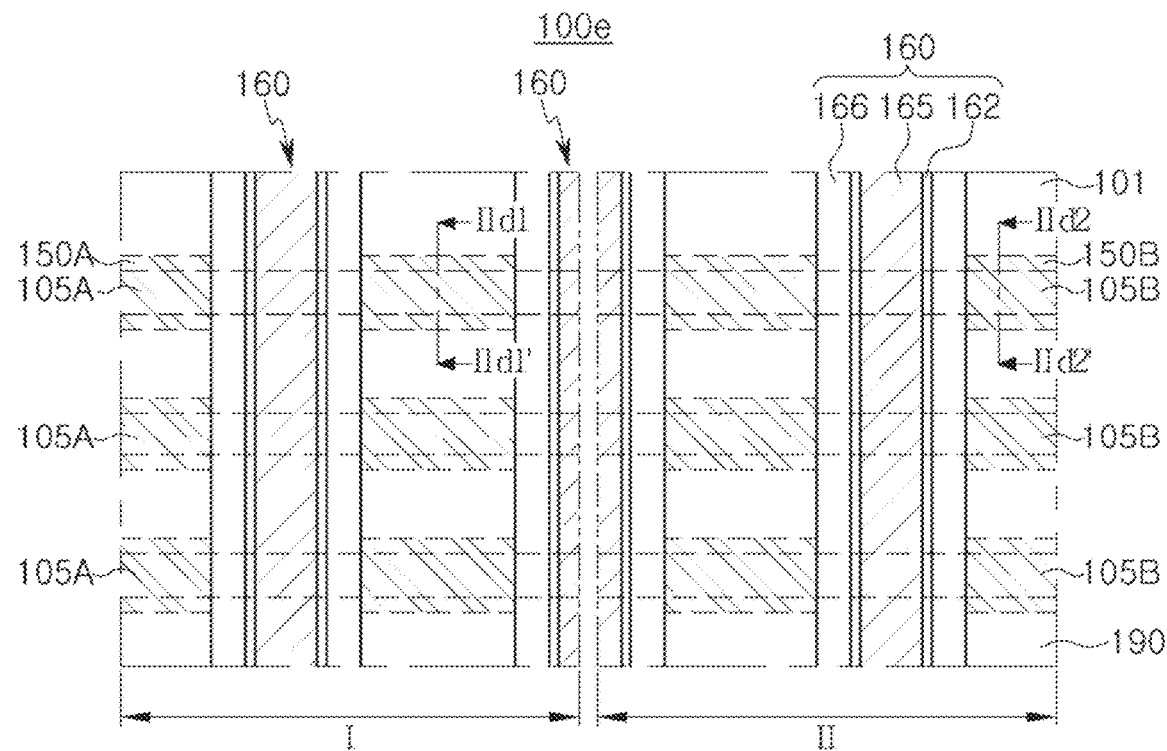
FIGS. 9A and 9B are a plan view and a cross-sectional view illustrating a semiconductor device according to example embodiments.
Figure 9B:
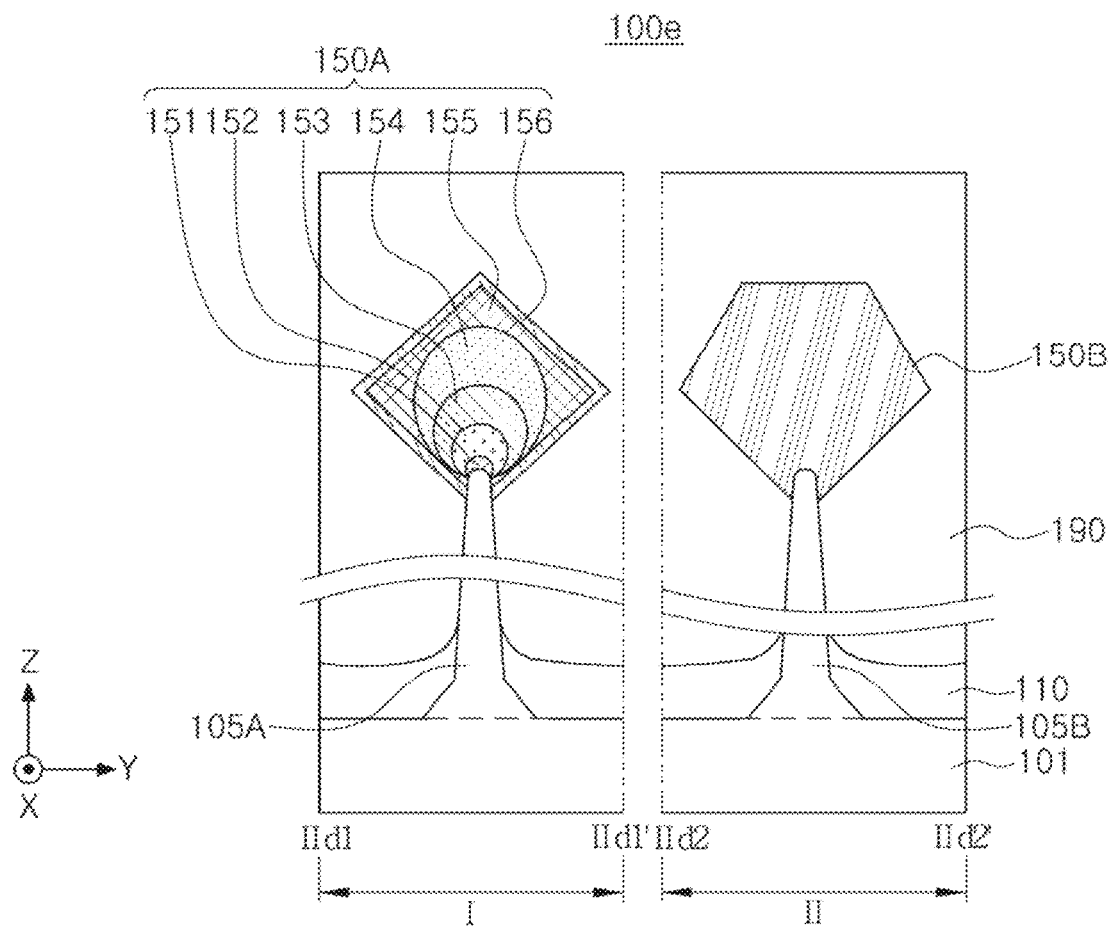

FIGS. 9A and 9B are a plan view and a cross-sectional view illustrating a semiconductor device according to example embodiments. FIG. 9B illustrates a cross-section of the semiconductor device of FIG. 9A, taken along lines IId1-IId1' and IId2-IId2'.

Referring to FIGS. 9A and 9B, a semiconductor device 100*e* may include a substrate 101 having a first region I and a second region II, a first active fin 105A and a second active fin 105B, element isolation layers 110, first source/drain regions 150A and second source/drain regions 150B, a gate structure 160, and an interlayer insulating layer 190. In the semiconductor device 100*e*, PMOS transistors may be disposed in the first region I, while NMOS transistors may be disposed in the second region II.

The active fins 105A and the second active fins 105B may be disposed in the first region I and the second region II, respectively, and may include impurities having different conductivity types. According to example embodiments, the gate structures 160 may have different structures in the first region I and the second region II. For example, materials and work functions of the gate electrodes 165 may be different.

The first source/drain regions 150A and the second source/drain regions 150B may be disposed in the first region I and the second region II, respectively. The first source/drain regions 150A and the second source/drain regions 150B may be formed of semiconductor materials having different conductivity types. For example, the first source/drain regions 150A may include silicon germanium (SiGe) doped with a p-type impurities, while the second source/drain regions 150B may include silicon (Si) doped with an n-type impurities. The second source/drain regions 150B may not include germanium (Ge). The description of the source/drain region 150, described with reference to FIGS. 2 to 4D, may be similarly applied to the first source/drain regions 150A. The second source/drain regions 150B may be formed of a single layer, or may include a plurality of regions including doping elements with different concentrations.

As illustrated in FIG. 9B, the first source/drain regions 150A and the second source/drain regions 150B may have shapes with different cross-sections. For example, the first source/drain regions 150A may have a pentagon or a shape similar thereto, while the second source/drain regions 150B may have a hexagon or a shape similar thereto.

Figure 10A:
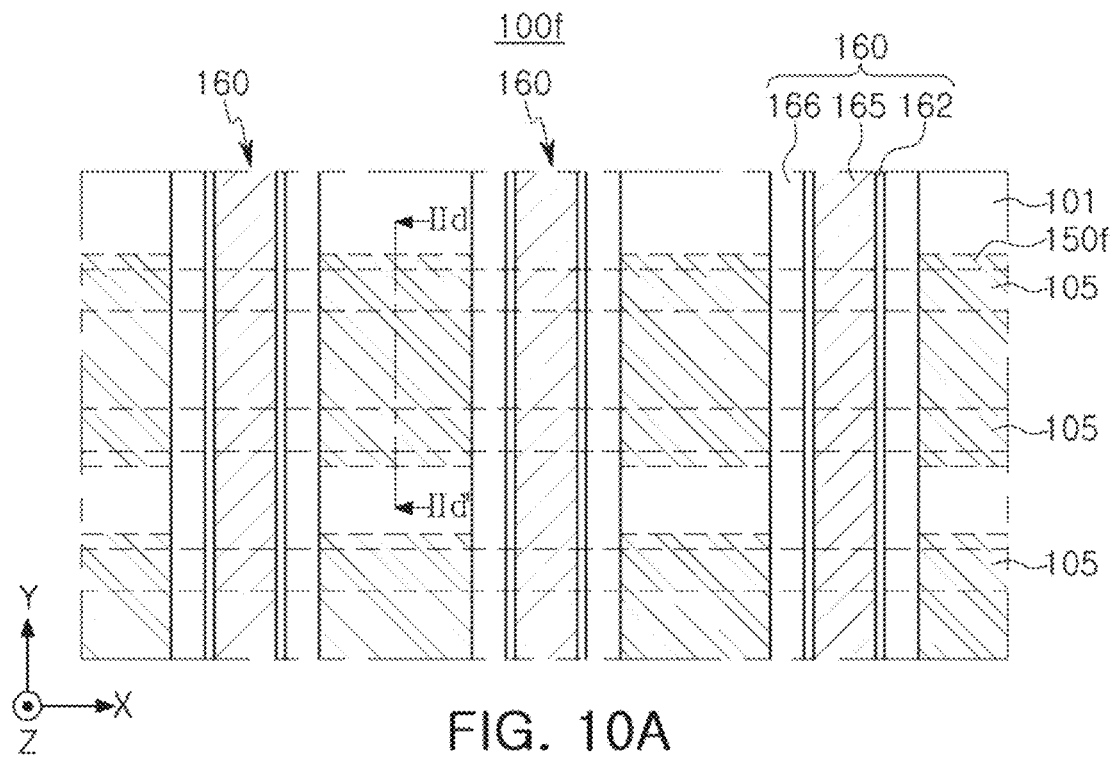
FIGS. 10A and 10B are a plan view and a cross-sectional view illustrating a semiconductor device according to example embodiments.
Figure 10B:
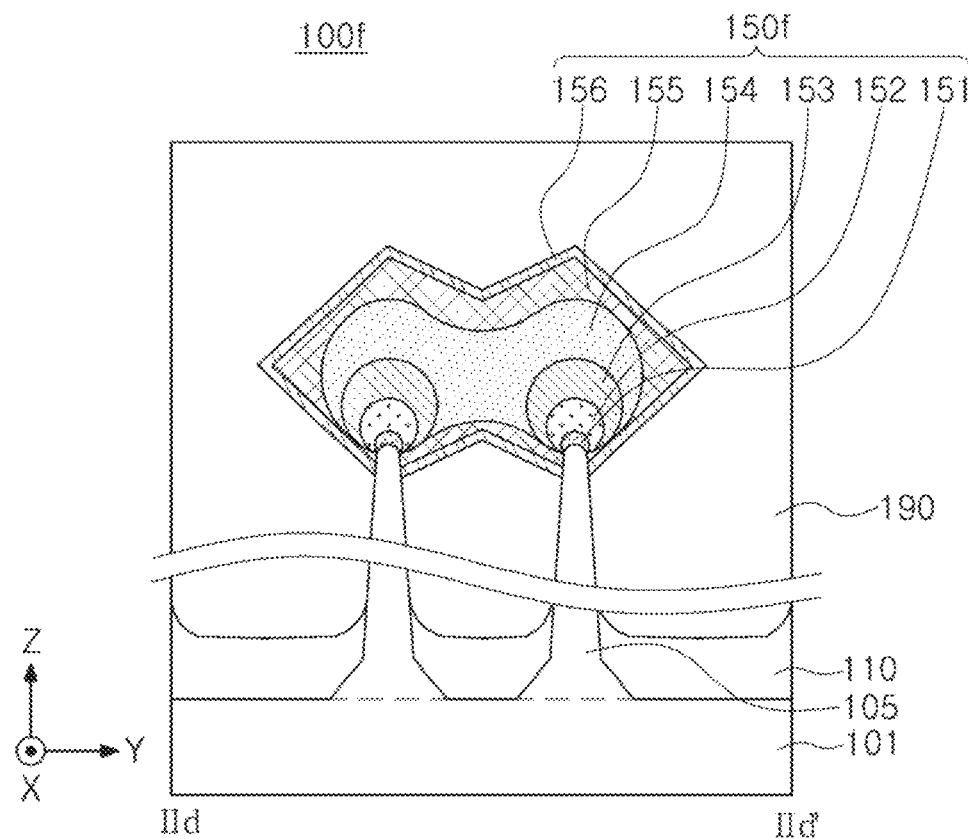

FIGS. 10A and 10B are a plan view and a cross-sectional view illustrating a semiconductor device according to example embodiments. FIG. 10B illustrates a cross-section of the semiconductor device of FIG. 10A, taken along line IId-IId'.

Referring to FIGS. 10A and 10B, in a semiconductor device 100*f*, source/drain regions 150 may be connected or merged to each other on two active fins 105 to form a single source/drain region 150. However, the number of active fins 105, disposed below a single source/drain region 150 connected as described above is not limited to that illustrated in the drawing, and may be variously changed in example embodiments.

For example, in the source/drain region 150*f*, a base layer 151 as well as a first layer 152 and a second layer 153 may be disposed on each active fin 105, and third to fifth layers 154, 155, and 156 may have a connected form on two active fins 105. Thus, the planar arrangement of the base layer 151 as well as the first layer 152 and the second layer 153 may be the same as that according to an example embodiment of FIGS. 1 to 4D.

FIGS. 11A to 20B are drawings illustrating a process sequence of a method of manufacturing a semiconductor device according to example embodiments. In FIGS. 11A to 20B, a method for manufacturing the semiconductor device described above with reference with FIGS. 1 to 2D will be described.

Figure 11A:
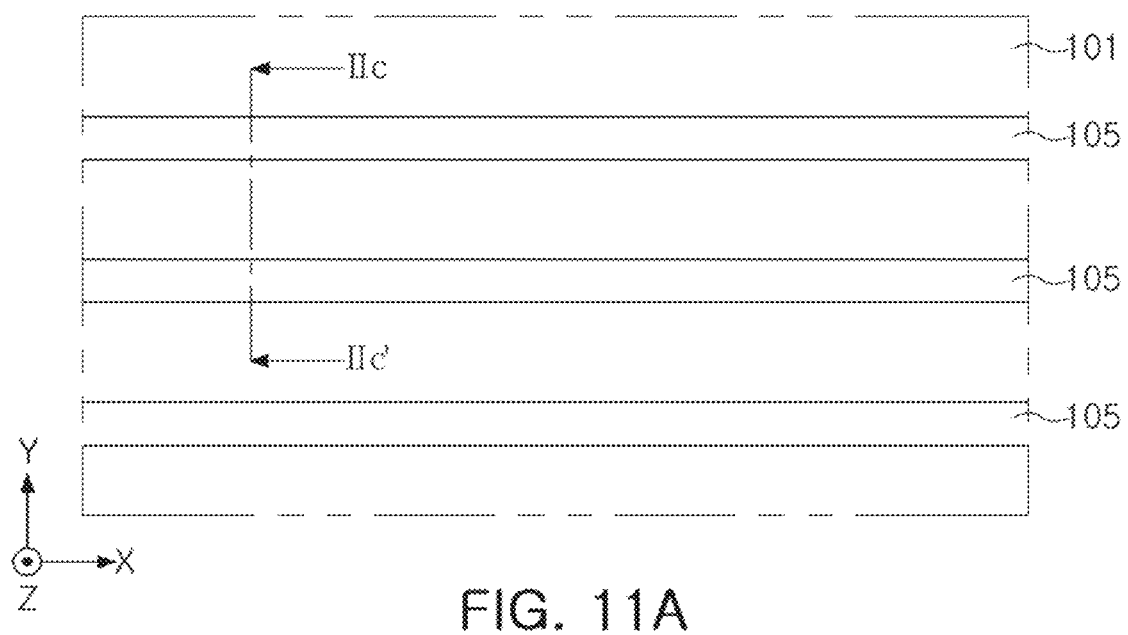
FIGS. 11A to 20B are drawings illustrating a process sequence of a method of manufacturing a semiconductor device according to example embodiments.
Figure 11B:
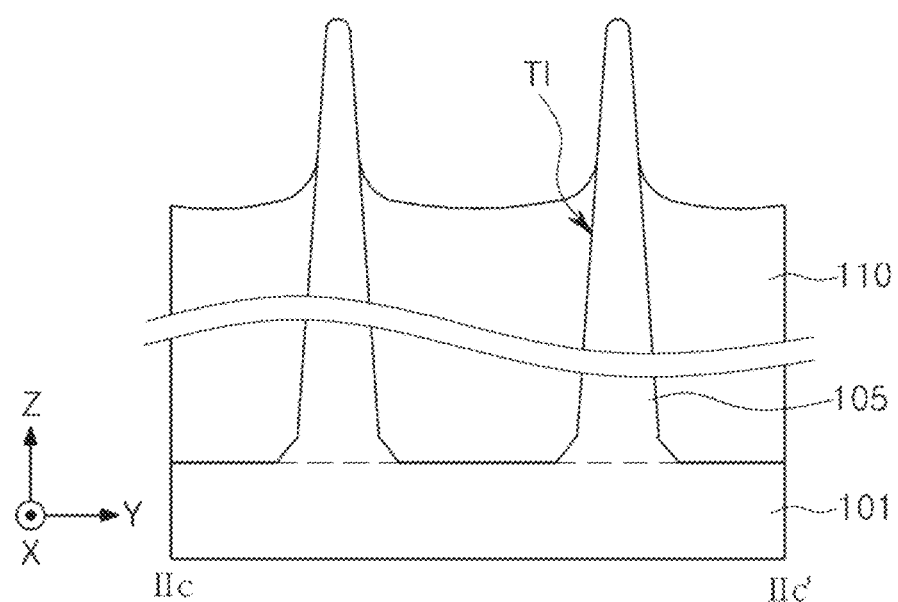

Referring to FIGS. 11A and 11B, a substrate 101 is patterned to form active fins 105 and element isolation layers 110.

First, a mask layer for patterning the substrate 101 is formed on the substrate 101, and the substrate 101 is anisotropically etched using the mask layer to form trenches TI. The trenches TI may be formed in a region except for the active fins 105. The trenches TI have a high aspect ratio, and thus may have a width becoming narrower downwardly. Thus, the active fins 105 may have a shape becoming narrower upwardly.

Then, an operation of filling the trenches TI with an insulating material and planarizing may be performed. Then, the insulating material, with which the trenches TI is filled, is partially removed, so the active fins 105 may protrude from the element isolation layer 110. The operation described above may be performed using, for example, a wet etching process. Thus, the active fins 105 may protrude from an upper portion of the element isolation layer 110 by a desired (and/or alternatively predetermined) height, and a protruding height may be variously changed in example embodiments.

Figure 12A:
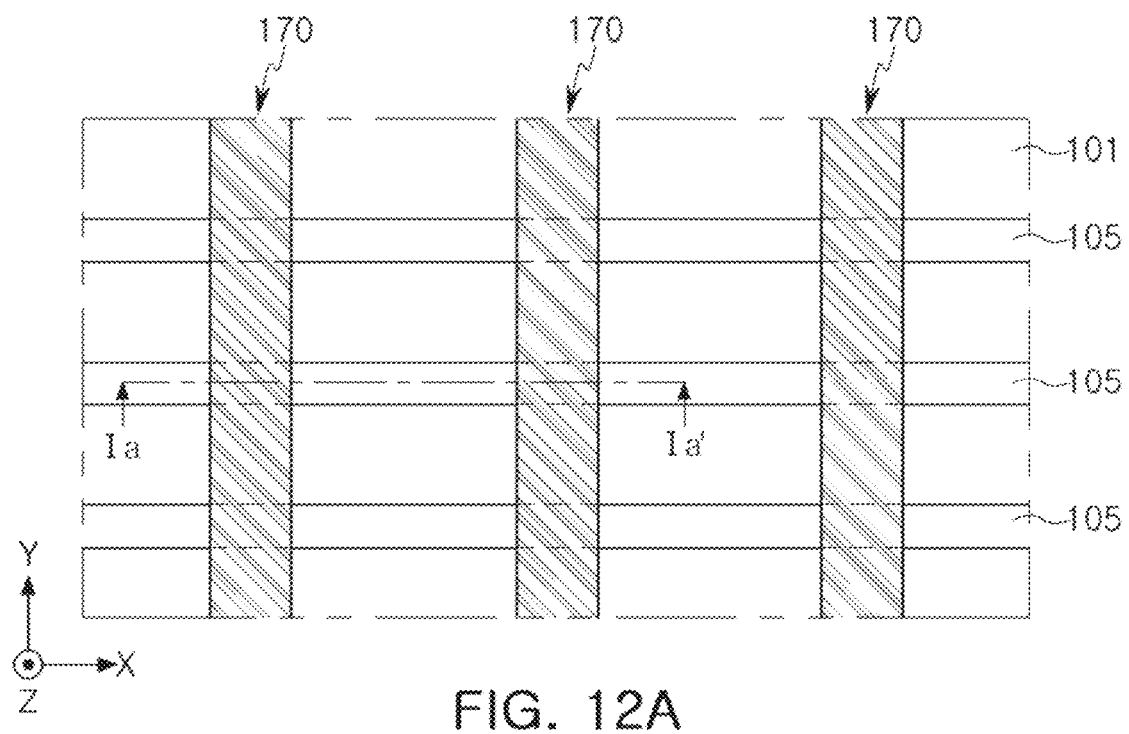
Figure 12B:
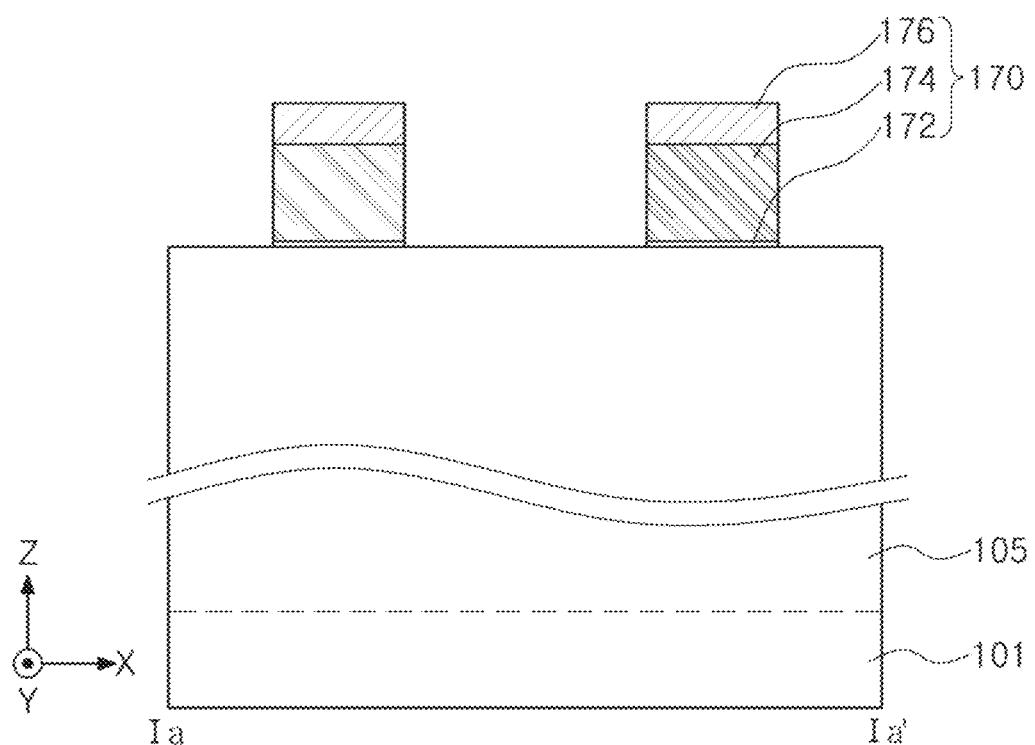

Referring to FIGS. 12A and 12B, sacrificial gate structures 170 may be formed in the active fins 105 and the element isolation layer 110.

The sacrificial gate structures 170 may be a sacrificial layer formed in a region in which the gate dielectric layer 162 and the gate electrode 165 are disposed as illustrated in FIG. 1 through a subsequent operation. The sacrificial gate structures 170 may be patterned to have a shape of a line extended in the Y-direction while intersecting the active fins 105.

The sacrificial gate structure 170 may include a first sacrificial layer 172 and a second sacrificial layer 174 as well as a mask pattern layer 176, sequentially stacked. The mask pattern layer 176 may be a hard mask layer remaining after the first sacrificial layer 172 and the second sacrificial layer 174 are patterned. The first sacrificial layer 172 and the mask pattern layer 176 may be an insulating layer, while the second sacrificial layer 174 may be a conductive layer, but an example embodiment is not limited thereto. For example, the first sacrificial layer 172 may include a silicon oxide, the second sacrificial layer 174 may include polysilicon, and the mask pattern layer 176 may include a silicon nitride. The number of layers forming the sacrificial gate structure 170 and the material thereof may be variously changed according to example embodiments.

Figure 13A:
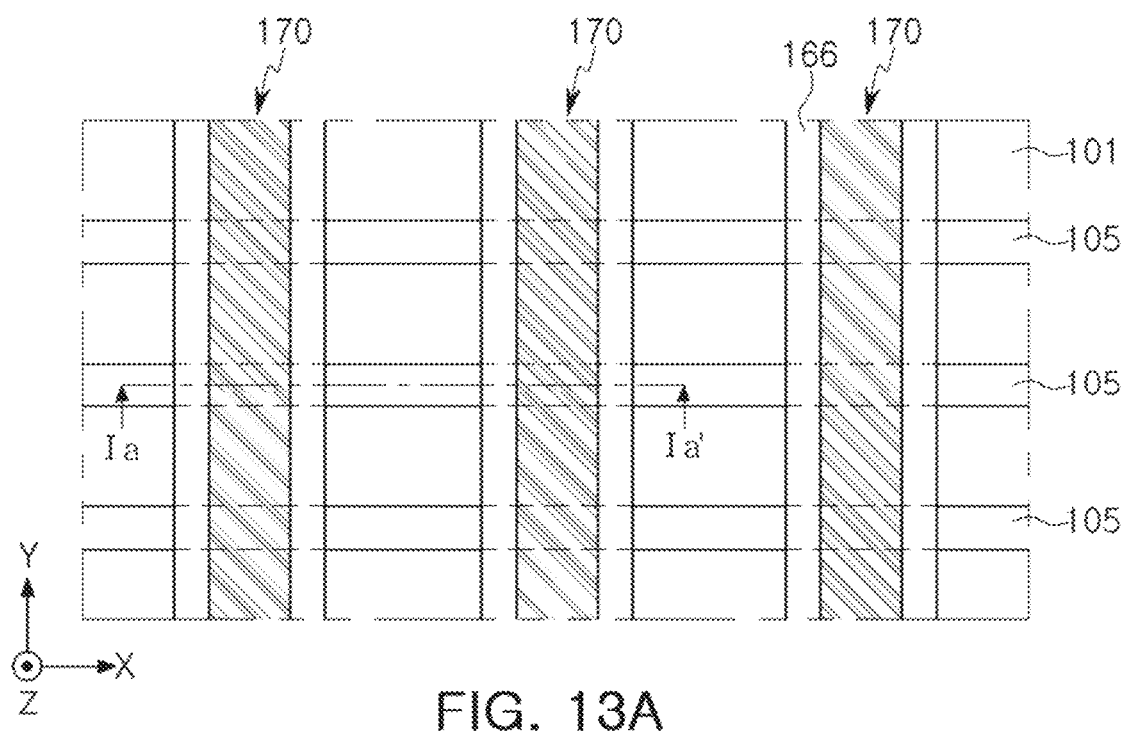
Figure 13B:
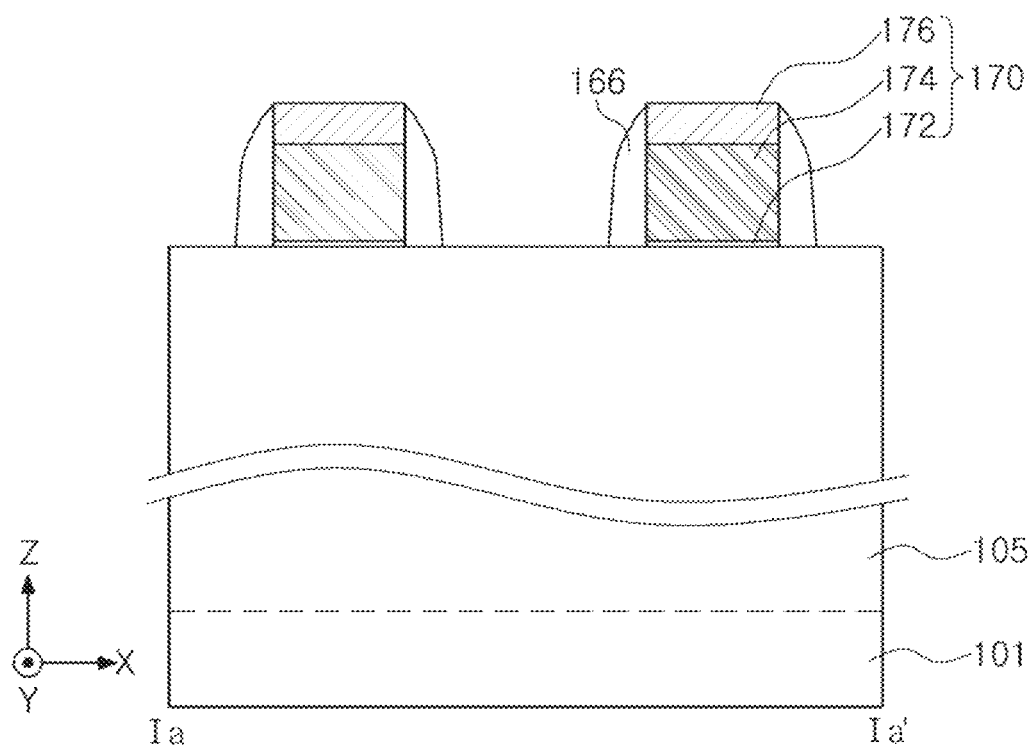

Referring to FIGS. 13A and 13B, gate spacer layers 166 may be formed on side surfaces of the sacrificial gate structures 170.

A spacer forming material is deposited to a uniform thickness along an upper surface and/or a side surface of the active fins 105, the element isolation layers 110, and the sacrificial gate structures 170, and then may be anisotropically etched to form the gate spacer layers 166.

The gate spacer layers 166 may be formed of an insulating material. For example, the gate spacer layers 166 may be formed of a low dielectric constant material, and may include at least one among SiO, SiN, SiCN, SiOC, SiON, and SiOCN. In example embodiments, the gate spacer layers 166 may have a structure in which a plurality of films are stacked. During formation of the gate spacer layers 166, a spacer may be also formed on a side surface of the active fins 105.

Figure 14A:
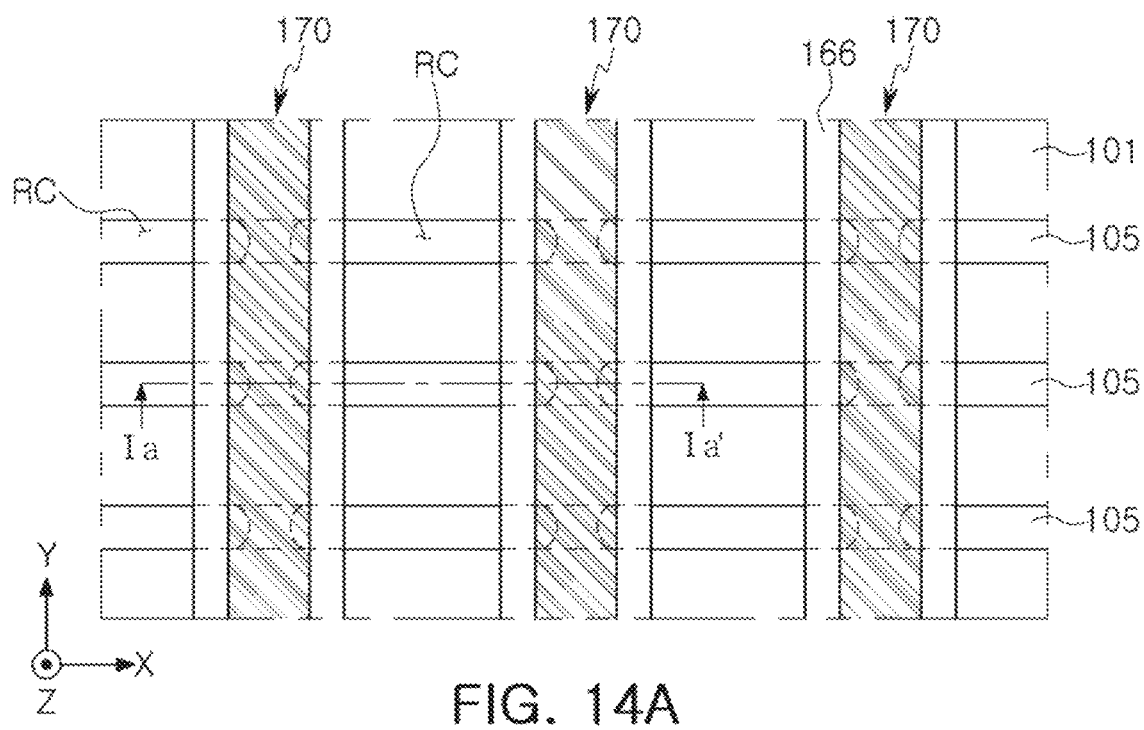
Figure 14B:
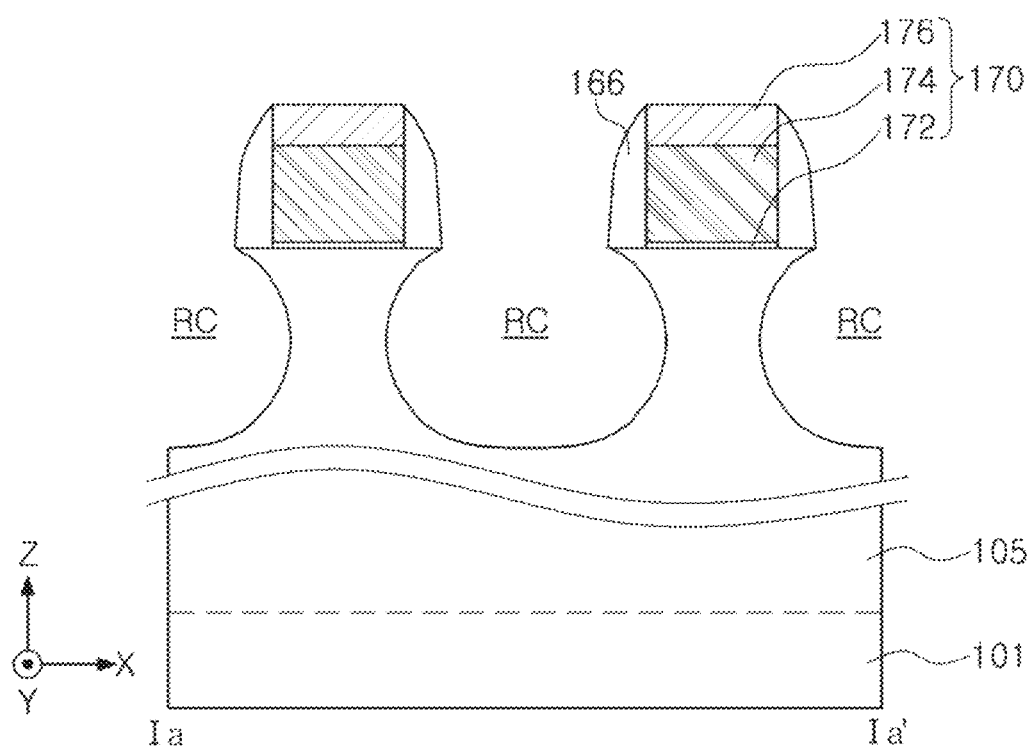

Referring to FIGS. 14A and 14B, the active fins 105 are recessed between the sacrificial gate structures 170 to form recess regions RC.

The active fins 105, having been exposed, are recessed to a desired (and/or alternatively predetermined) depth from an upper surface of the active fins between the sacrificial gate structures 170, to form the recess regions RC. The recess process may be performed by sequentially applying a dry etching process and a wet etching process, for example. Thus, the active fins 105 may have a lower level between the sacrificial gate structures 170, as compared a level of the active fins below the sacrificial gate structures 170.

The recess regions RC may be extended toward lower portions of the gate spacer layers 166 and the sacrificial gate structures 170. Thus, the recess regions RC may be formed over an expanded region, as compared with a space between the gate spacer layers 166, in the active fins 105. In the recess regions RC, end portions in the X-direction may be located below the gate spacer layers 166 and the sacrificial gate structures 170 on a plane, and may have a shape concave outwardly of the sacrificial gate structures 170. According to example embodiments, both ends of an upper surface of the recess regions RC are located below the gate spacer layers 166 or the sacrificial gate structures 170, and thus may include an undercut region.

Selectively, after the recess regions RC are provided, an operation of curing a recessed surface of the active fins 105 may be performed using a separate operation. Moreover, before or after the recess operation, an operation of injecting impurities into the active fins 105 may be performed. The impurity injection operation may be performed using the sacrificial gate structures 170 and the gate spacer layers 166 as a mask.

Figure 15A:
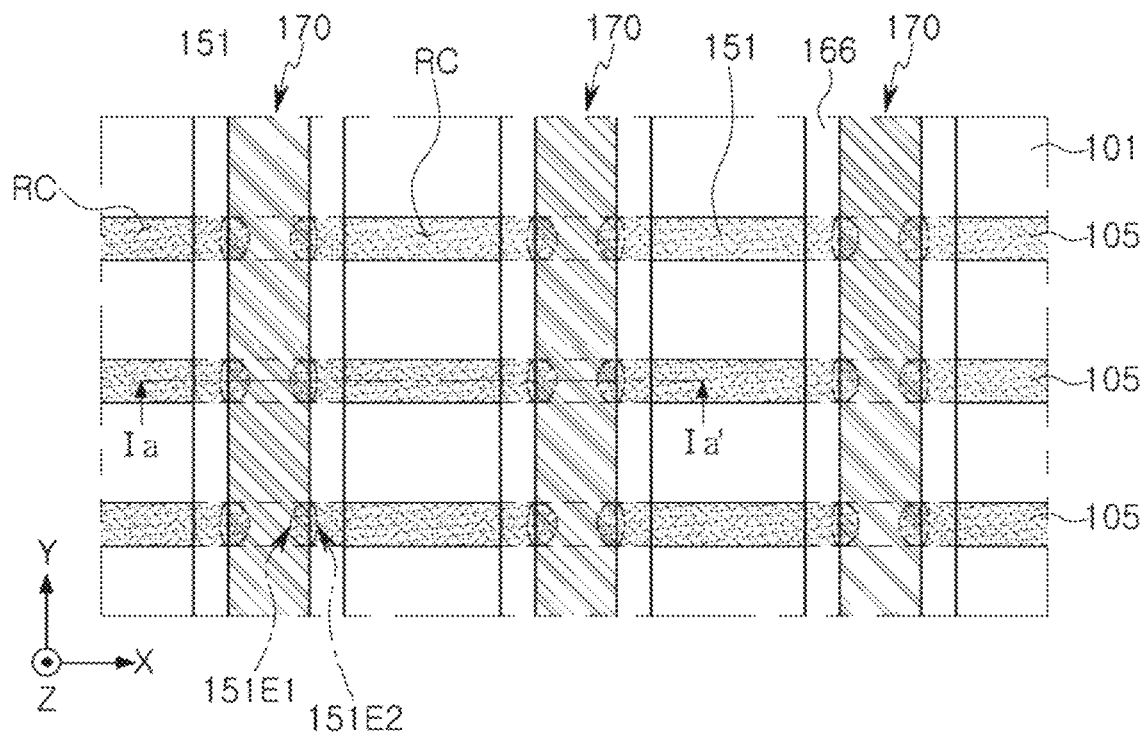
Figure 15B:
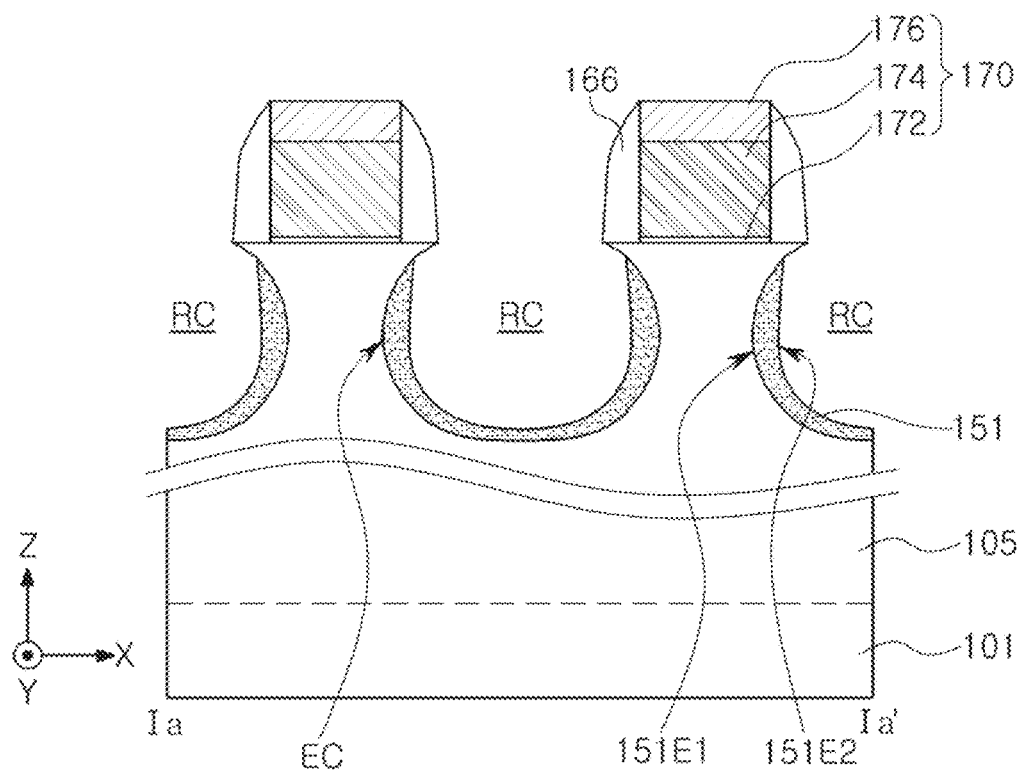

Referring to FIGS. 15A and 15B, the base layers 151 of the source/drain regions 150 may be provided in the recess regions RC.

The base layers 151 may be grown from the active fins 105, using a selective epitaxial growth (SEG) process, for example. The base layers 151 may be, for example, a silicon (Si) layer. Alternatively, the base layers 151 may be, for example, a silicon germanium (SiGe) layer. In this case, the base layers may include germanium (Ge) having a concentration lower than that of the first layer 152 to be formed thereabove. The base layers 151 may further include doping elements such as boron (B), and a concentration of the doping elements may be higher than that in the active fins 105. The doping elements may be in-situ doped during the growth of the base layers 151, or may be separately injected after the growth.

The base layers 151 may be formed on the entirety of the surface of the recess regions RC, and an outermost portion EC may be located below the sacrificial gate structures 170. According to etching conditions, a distance between the sacrificial gate structures 170, a width of the active fins 105, and the like, a shape, on a plane, of the inner end 151E1 in which the base layers 151 are in contact with active fins 105 on an inner sidewall of the recess regions RC may be variously changed. However, in this case, the inner end 151E1 may have a shape generally concave outwardly of the sacrificial gate structures 170. The base layers 151 may have the outer end 151E2, illustrated by a dotted line in FIG. 15A, on an inner sidewall of the recess regions RC, and the outer end 151E2 may have a convex curved shape without facets.

Figure 16A:
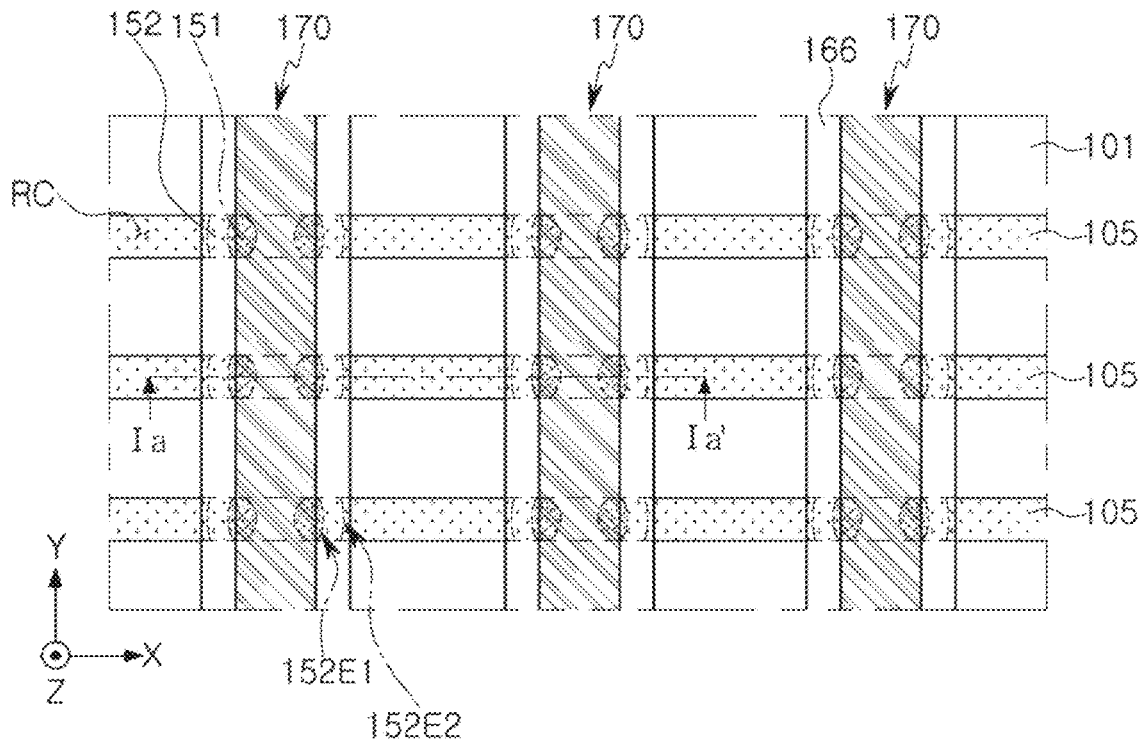
Figure 16B:
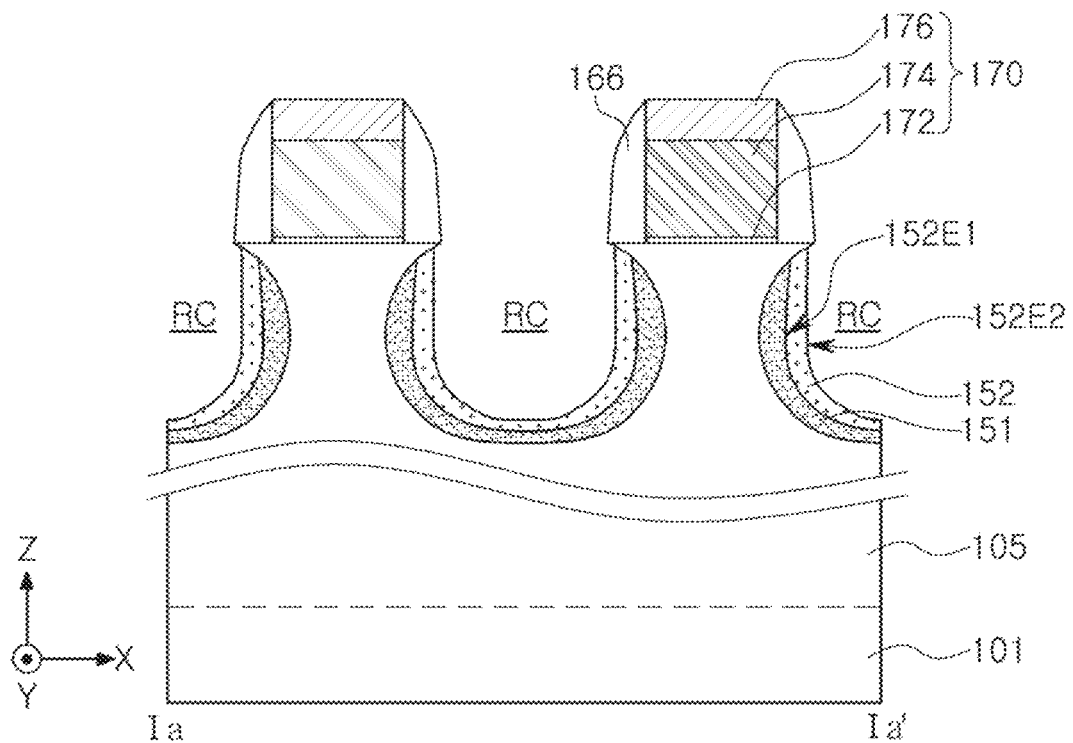

Referring to FIGS. 16A and 16B, first layers 152 may be formed on the base layers 151 of the source/drain regions 150.

The first layers 152 may be formed using, for example, a SEG process. The first layers 152 may be, for example, a silicon germanium (SiGe) layer. For example, when the base layers 151 are the silicon germanium (SiGe) layer, the first layers 152 may include germanium (Ge) having a concentration higher than that of the base layers 151. The first layers 152 may further include doping elements such as boron (B).

The first layers 152 may be formed on a surface of the base layers 151 in the recess regions RC, and an outermost portion, in contact with the base layers 151 on a plane may be located below the gate spacer layers 166. The inner end 152E1 of the first layers 152 may have a shape generally convex outwardly of the sacrificial gate structures 170. The first layers 152 are formed on the base layers 151, not having facets, so even an outer end 152E2, not in contact with the base layers 151, may also have a convex shape without facets.

Figure 17A:
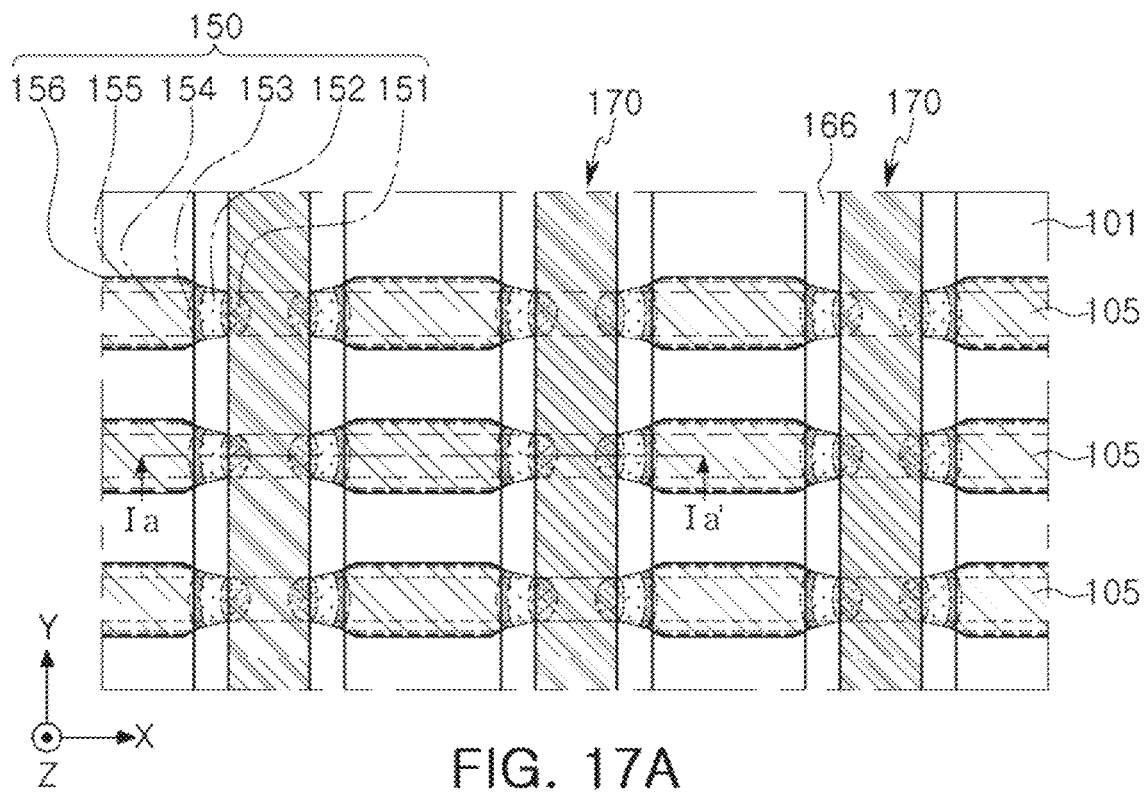
Figure 17B:
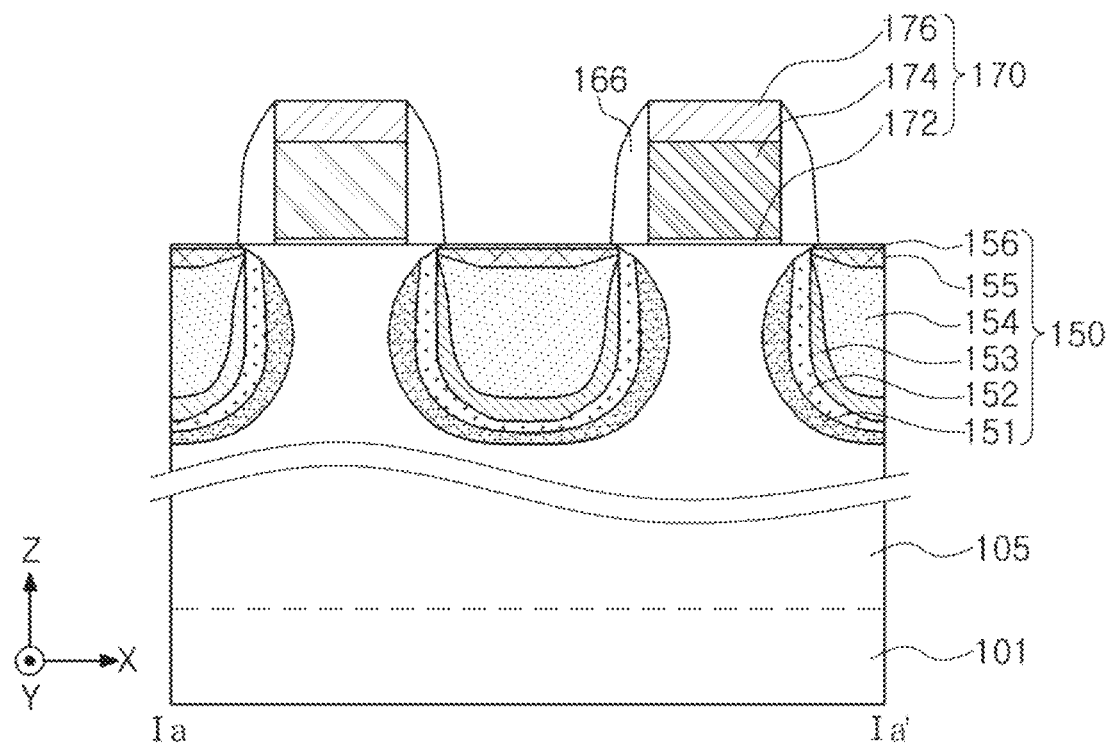

Referring to FIGS. 17A and 17B, second to fifth layers 153, 154, 155, and 156 are formed on the first layers 152, so source/drain regions 150 may be provided.

The second to fifth layers 153, 154, 155, and 156 may be formed using, for example, a SEG process. The second to fourth layers 153, 154, and 155 may be, for example, a silicon germanium (SiGe) layer, while the fifth layers 156 may be a silicon (Si) layer. In the second to fourth layers 153, 154, and 155, a concentration of germanium (Ge) may be increased sequentially. The second to fifth layers 153, 154, 155, and 156 may further include doping elements such as boron (B). In the second to fourth layers 153, 154, and 155, a concentration of doping elements may be increased sequentially.

The second layers 153 may be formed on a surface of the first layers 152, and the third layers 154 may be formed relatively thick so as to mostly fill the recess regions RC. The fourth and fifth layers 155 and 156 may be formed relatively thin on a surface of the recess regions RC.

The source/drain regions 150 may have a greater width in the Y-direction on a plane between the sacrificial gate structures 170 than a width below the sacrificial gate structures 170, and may have a region of which a width is increased.

Figure 18A:
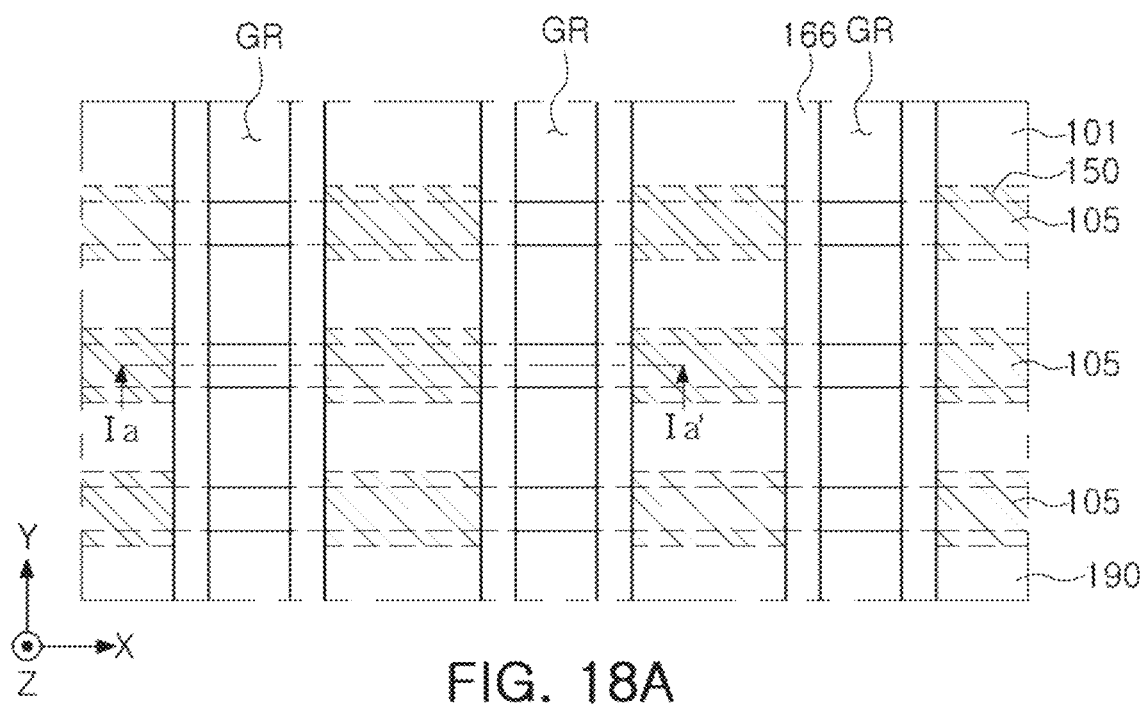
Figure 18B:
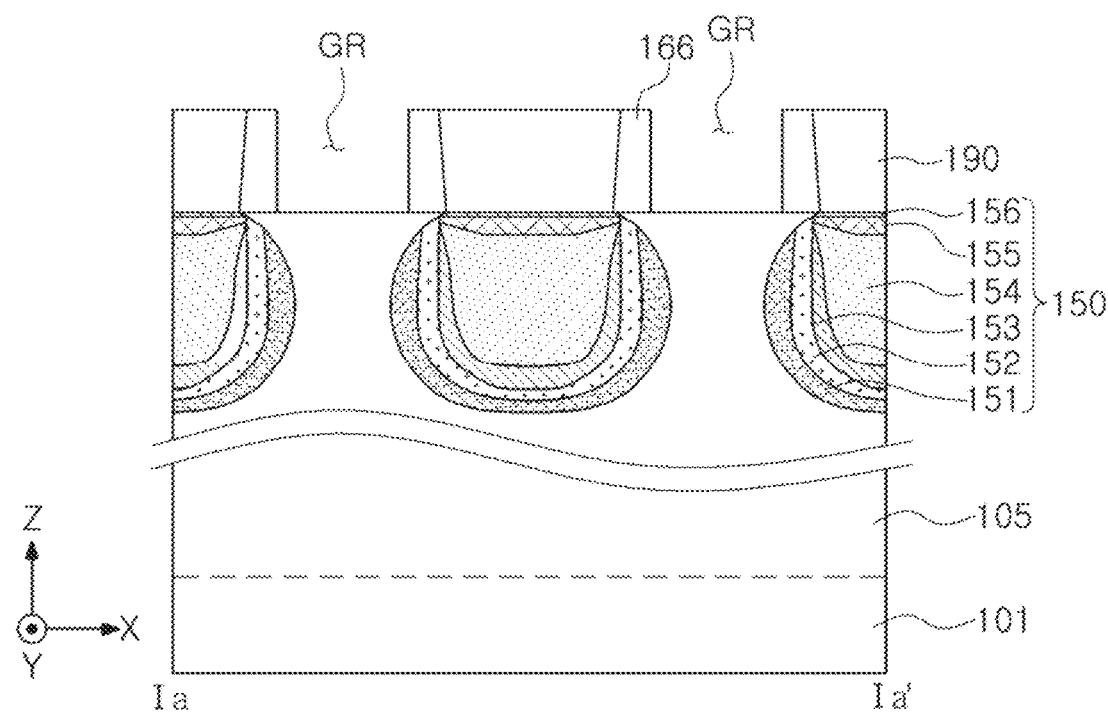

Referring to FIGS. 18A and 18B, an interlayer insulating layer 190 is formed above sacrificial gate structures 170, gate spacer layers 166, element isolation layers 110, and source/drain regions 150, and first and second sacrificial layers 172 and 174 may be removed therefrom.

After an insulating material is deposited to cover the sacrificial gate structures 170, the gate spacer layers 166, the element isolation layers 110, and the source/drain regions 150, an upper surface of the second sacrificial layers 174 is exposed through a planarizing process, so the interlayer insulating layer 190 may be provided. Thus, a mask pattern layer 176 of the sacrificial gate structures 170 may be removed at this operation. The interlayer insulating layer 190 may include, for example, at least one among an oxide, a nitride, and an oxynitride, and may include a low-k material.

Then, the first and second sacrificial layers 172 and 174 of the sacrificial gate structures 170 are selectively removed with respect to the element isolation layer 110 and the active fins 105, located therebelow, so an opening GR, exposing the element isolation layer 110 and the active fins 105, may be provided. A removal operation of the first and second sacrificial layers 172 and 174 may be at least one of a dry etching process and a wet etching process.

Figure 19A:
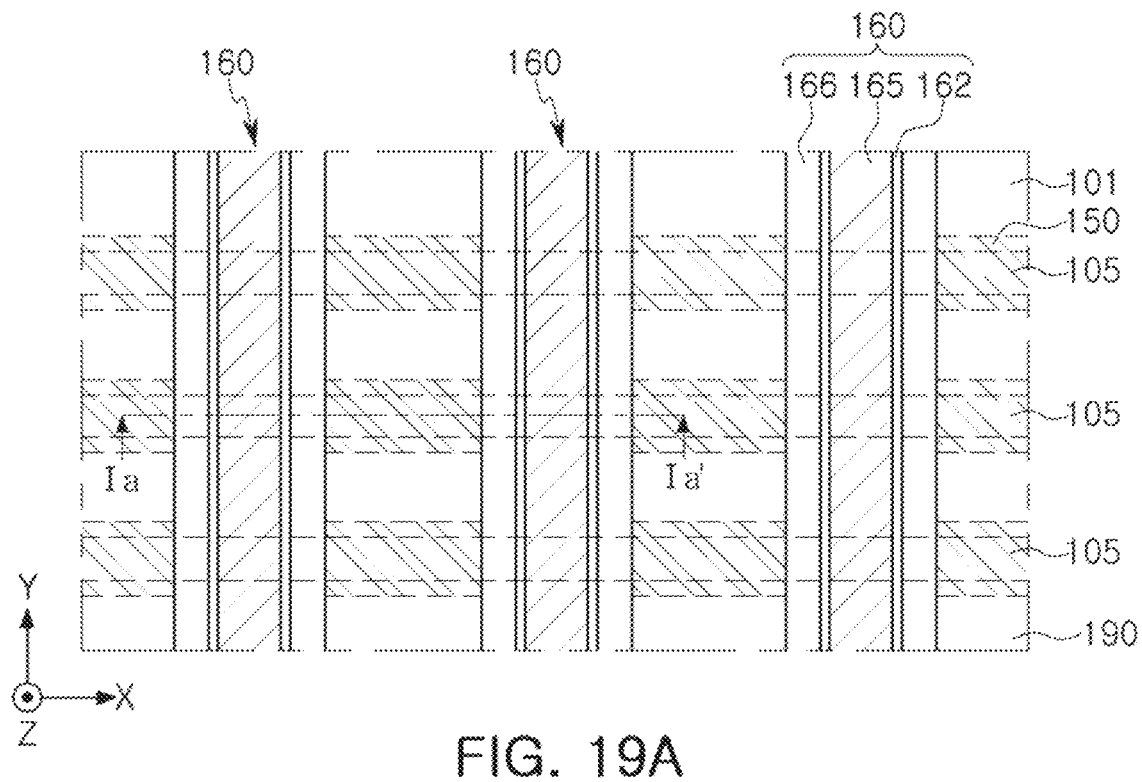
Figure 19B:
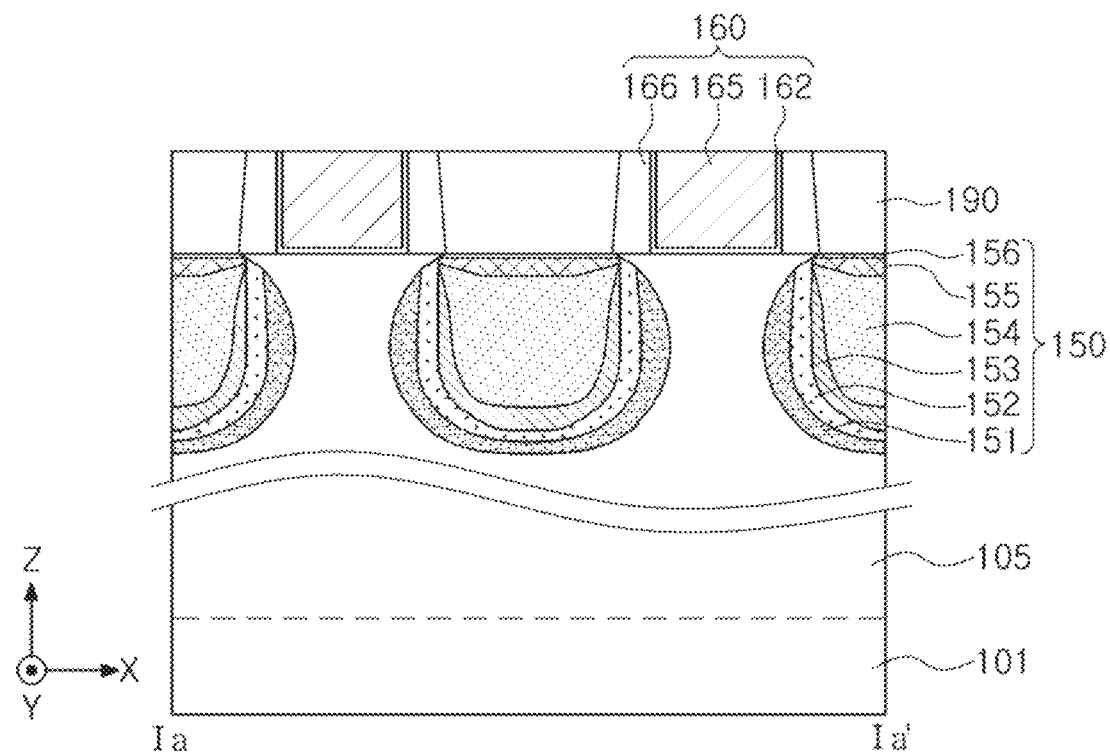

Referring to FIGS. 19A and 19B, gate dielectric layers 162 and gate electrodes 165 are formed in the opening GR, thereby ultimately forming gate structures 160.

The gate dielectric layers 162 may be formed substantially conformally along a side wall and a lower surface of the opening GR. The gate dielectric layers 162 may include an oxide, a nitride, or a high-k material. The gate electrodes 165 may be formed to fill a space inside the gate dielectric layers 162. The gate electrodes 165 may include a metal or a semiconductor material.

After the gate dielectric layers 162 and the gate electrodes 165 are formed, a material remaining on the interlayer insulating layer 190 may be removed therefrom using a planarizing process such as a chemical mechanical polishing (CMP) process.

Figure 20A:
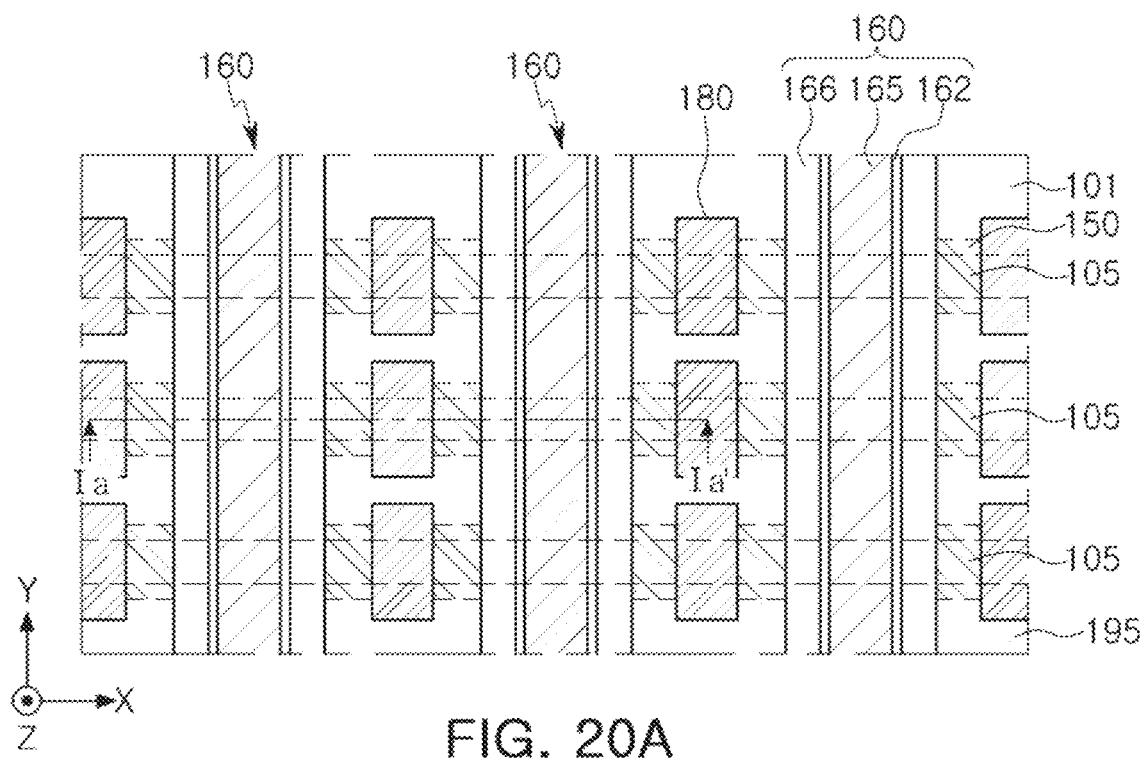
Figure 20B:
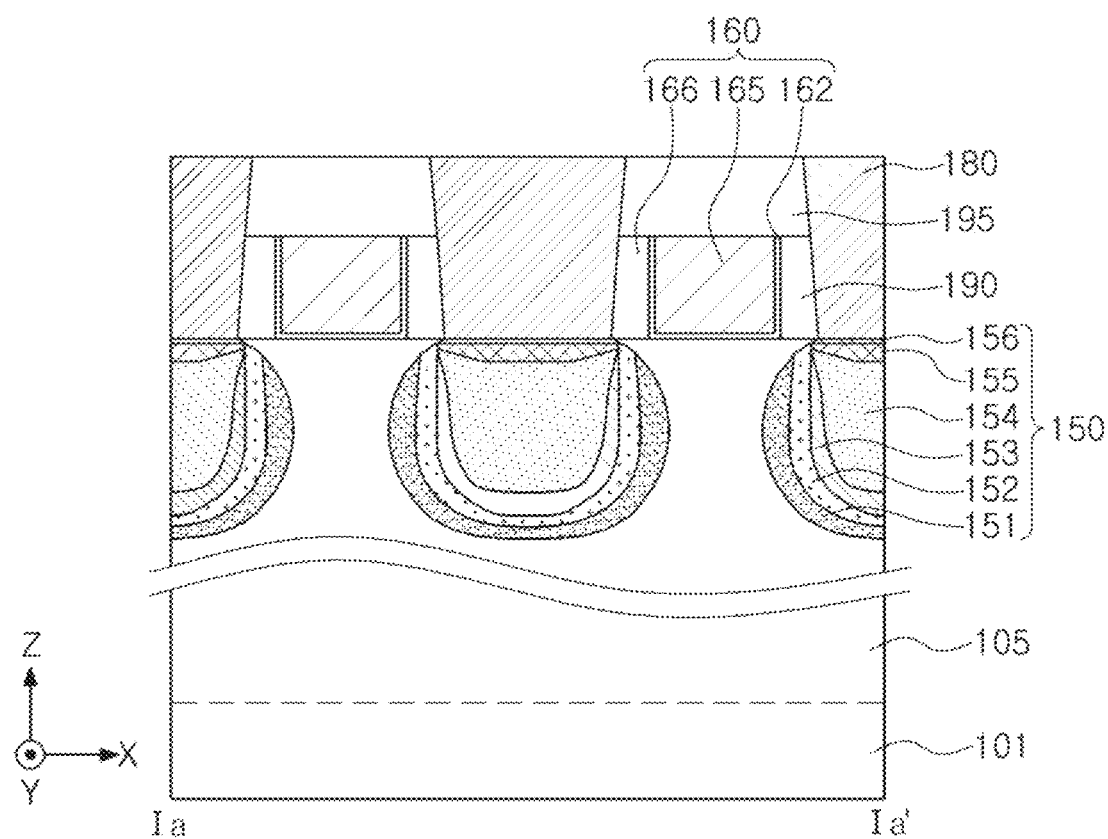

Referring to FIGS. 20A and 20B, the interlayer insulating layer 190 is patterned to form contact holes, and a conductive material may be embedded in the contact holes to form contact plugs 180.

First, an upper insulating layer 195 may be further formed on the interlayer insulating layer 190 and the gate structures 160. Then, a separate mask layer such as a photoresist pattern may be formed, and the interlayer insulating layer 190 and the upper insulating layer 195 are removed from both sides of the gate structure 160, so the contact holes may be provided. A lower surface of the contact holes may allow at least a portion of the source/drain regions 150 to be recessed.

Then, a conductive material is deposited in the contact holes, so contact plugs 180, electrically connected to the source/drain regions 150, may be provided. Before deposition of the conductive material, impurities may be injected into a lower portion of the contact holes to reduce contact resistance. Thus, a concentration of impurities in a region adjacent to a lower end of the contact plugs 180 may be increased as compared with a concentration of impurities after formation of the source/drain regions 150. In example embodiments, a shape and placement of the contact plugs 180 may be variously changed.

FIGS. 21A to 23B are drawings illustrating a process sequence of a method of manufacturing a semiconductor device according to example embodiments. In FIGS. 21A to 23B, a method for manufacturing the semiconductor device described above with reference with FIGS. 7A to 7B will be described.

Figure 21A:
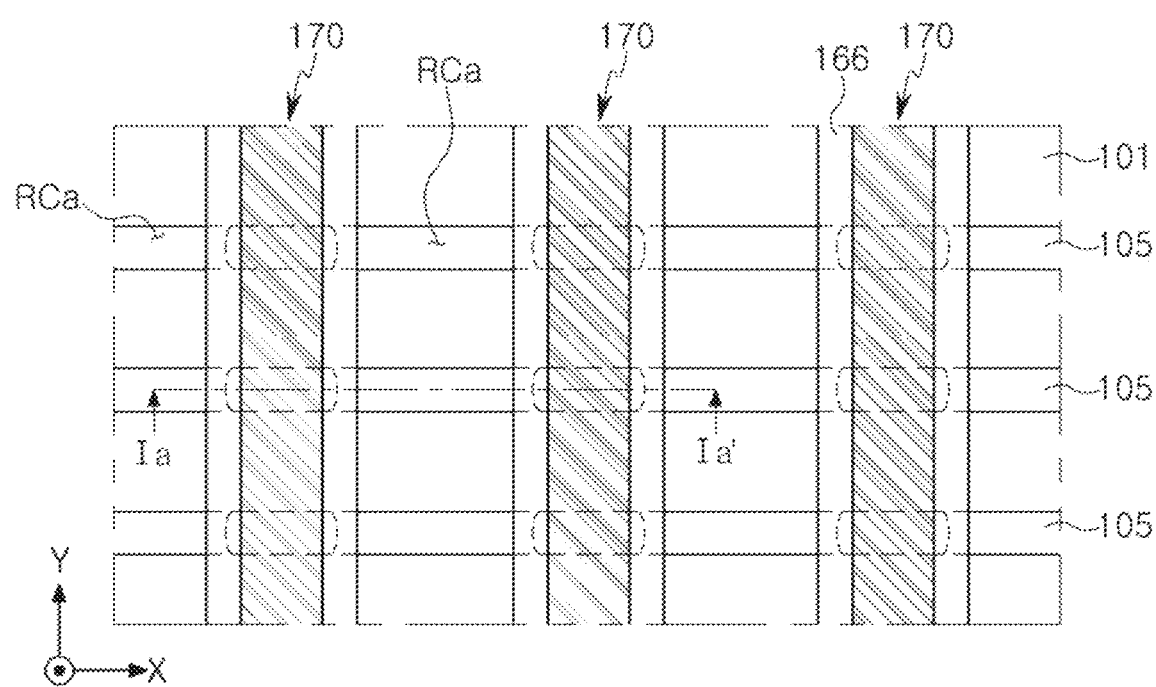
FIGS. 21A to 23B are drawings illustrating a process sequence of a method of manufacturing a semiconductor device according to example embodiments.
Figure 21B:
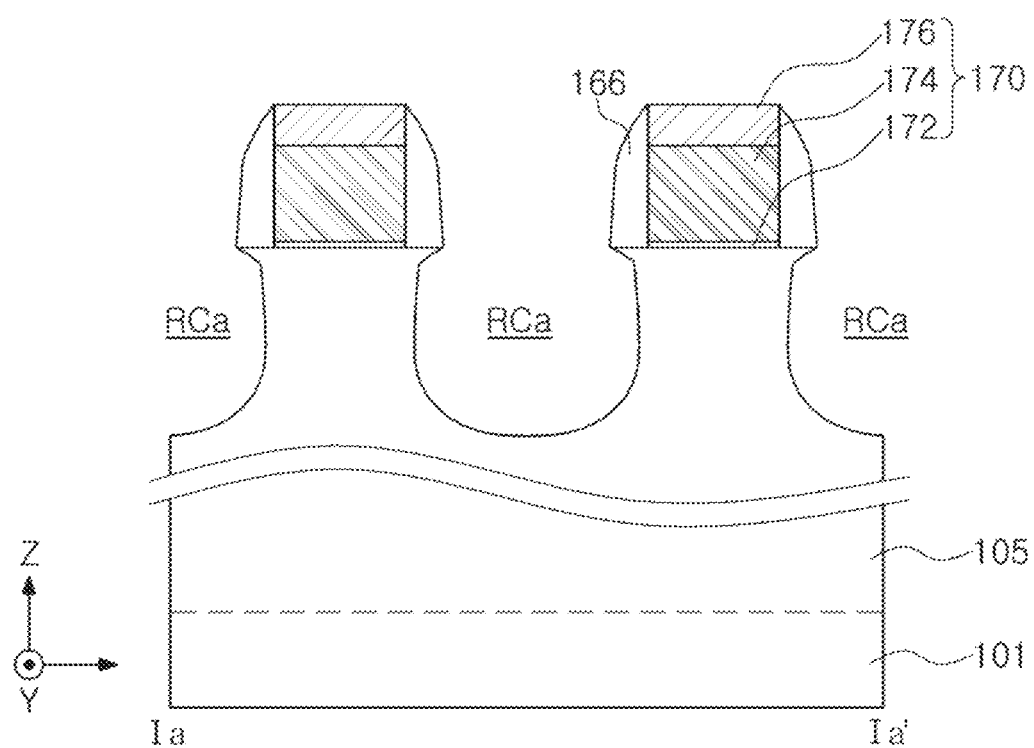

Referring to FIGS. 21A and 21B, the active fins 105 are recessed between the sacrificial gate structures 170 to form recess regions RCa.

First, the operations described above with reference to FIGS. 11A to 13B are performed in the same manner, so active fins 105, sacrificial gate structures 170, and gate spacer layers 166 may be provided.

Then, the active fins 105, having been exposed, are recessed to a desired (and/or alternatively predetermined) depth from an upper surface of the active fins between the sacrificial gate structures 170, to form the recess regions RCa. The recess process may be performed using a dry etching process and/or a wet etching process, for example. The recess regions RCa may be extended toward lower portions of the gate spacer layers 166 and the sacrificial gate structures 170 in the active fins 105. In the recess regions RCa, end portions in the X-direction may be located below the gate spacer layers 166 on a plane, and may have a shape convex outwardly of the sacrificial gate structures 170. However, in the recess regions RCa, a position of the end portions in the X-direction on a plane may be changed according to example embodiments, and may be located below the sacrificial gate structures 170.

Figure 22A:
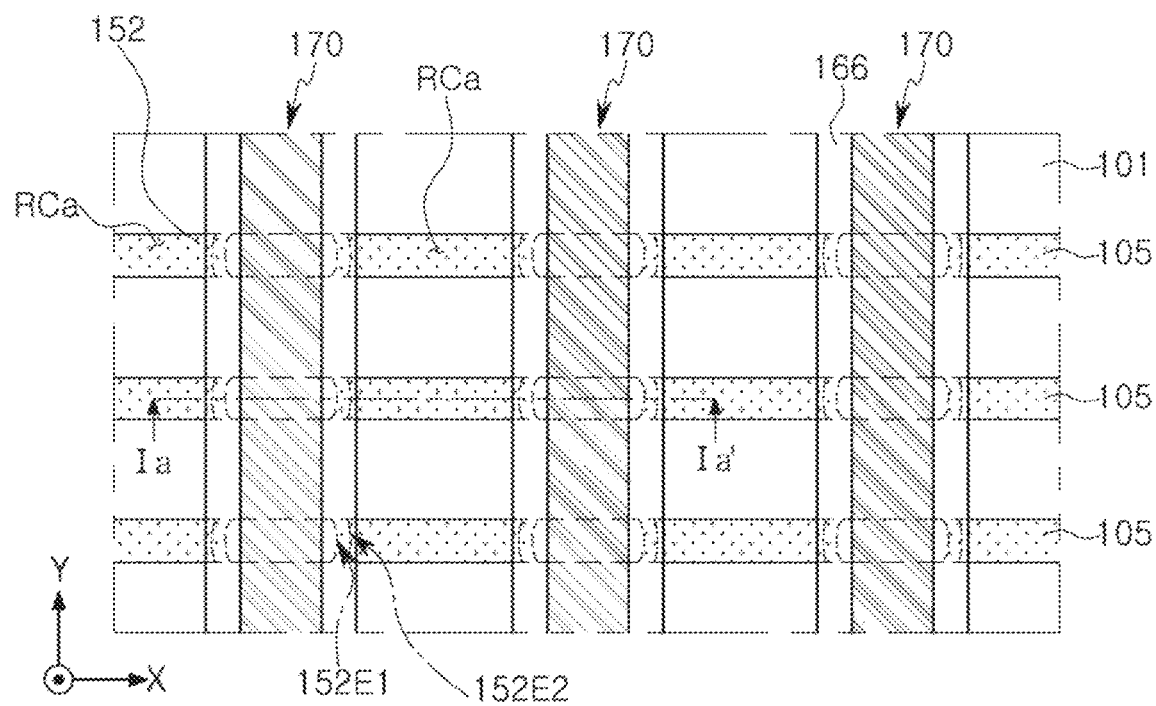
Figure 22B:
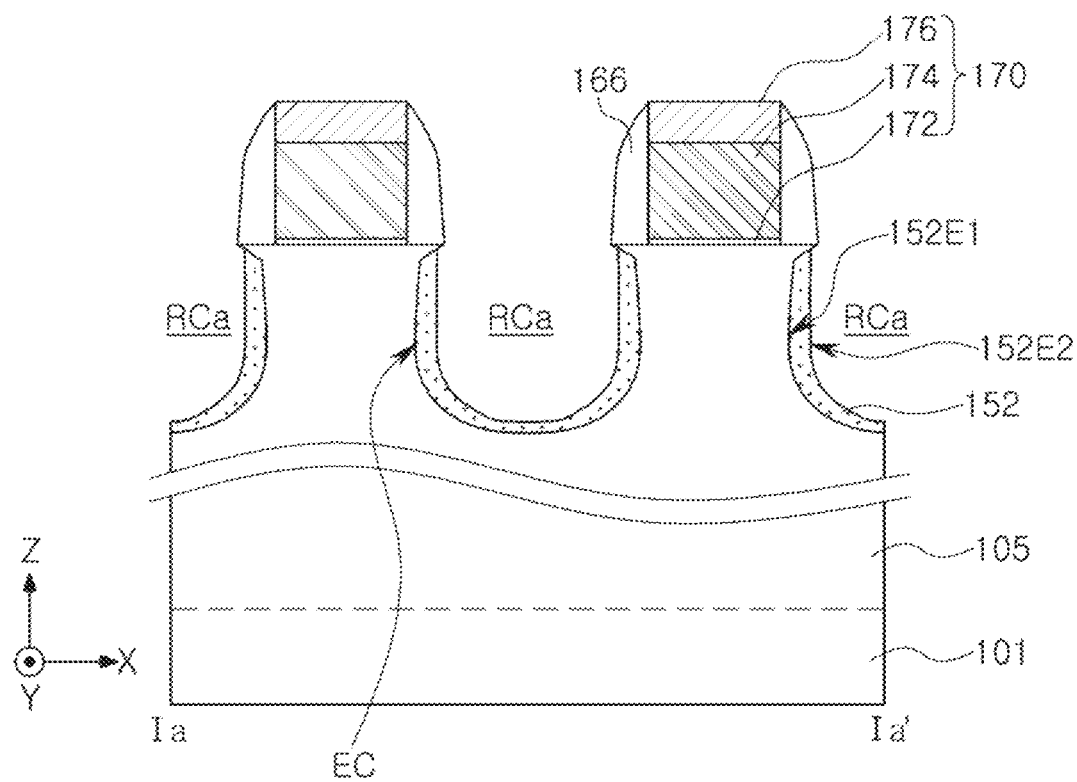

Referring to FIGS. 22A and 22B, the first layers 152 of the source/drain regions 150 may be provided in the recess regions RCa.

The first layers 152 may be grown from the active fins 105, using the SEG process, for example. The first layers 152 may be, for example, a silicon germanium (SiGe) layer. The first layers 152 may further include doping elements such as boron (B).

The first layers 152 may be formed on the entirety of the surface of the recess regions RCa, and an outermost portion EC may be located below the gate spacer layers 166. The inner end 152E1 of the first layers 152, in contact with the active fins 105, may have a shape generally convex outwardly of the sacrificial gate structures 170 on a plane according to a shape of the recess regions RCa. The first layers 152 may have the outer end 152E2, illustrated by an alternate long and short dash line in FIG. 22A, on an inner sidewall of the recess regions RCa, and the outer end 152E2 may have a convex curved shape without facets.

Figure 23A:
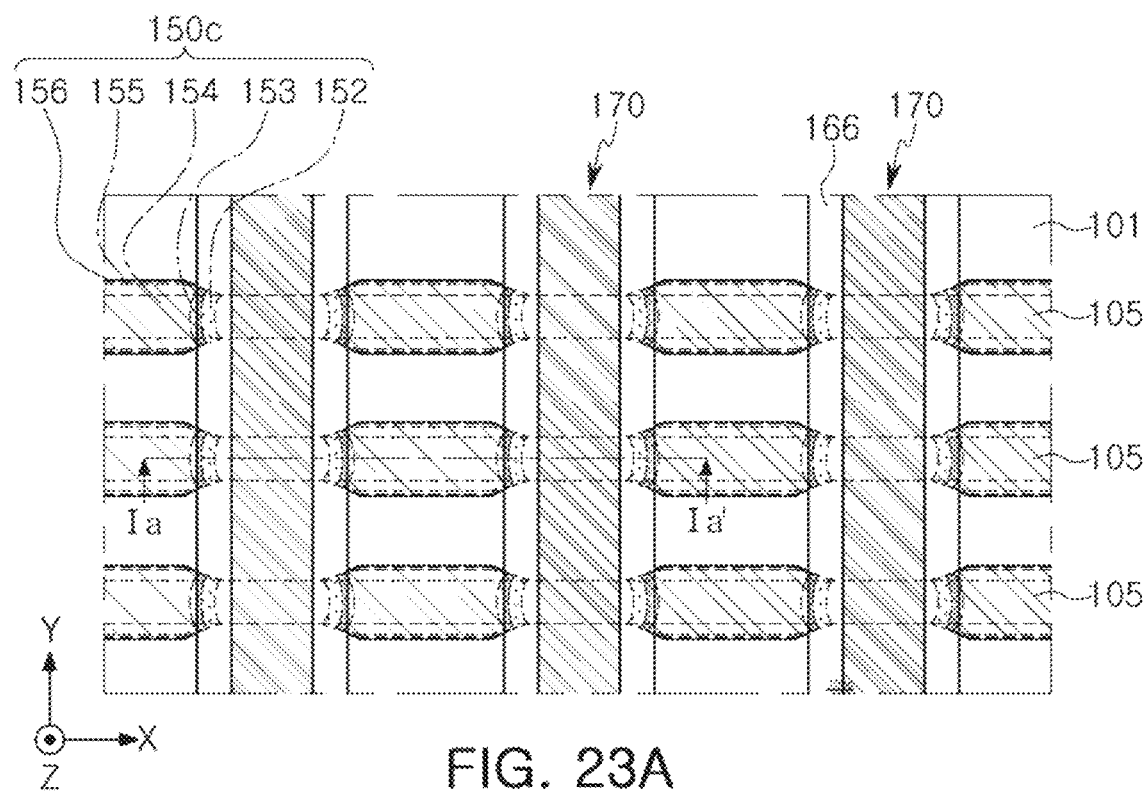
Figure 23B:
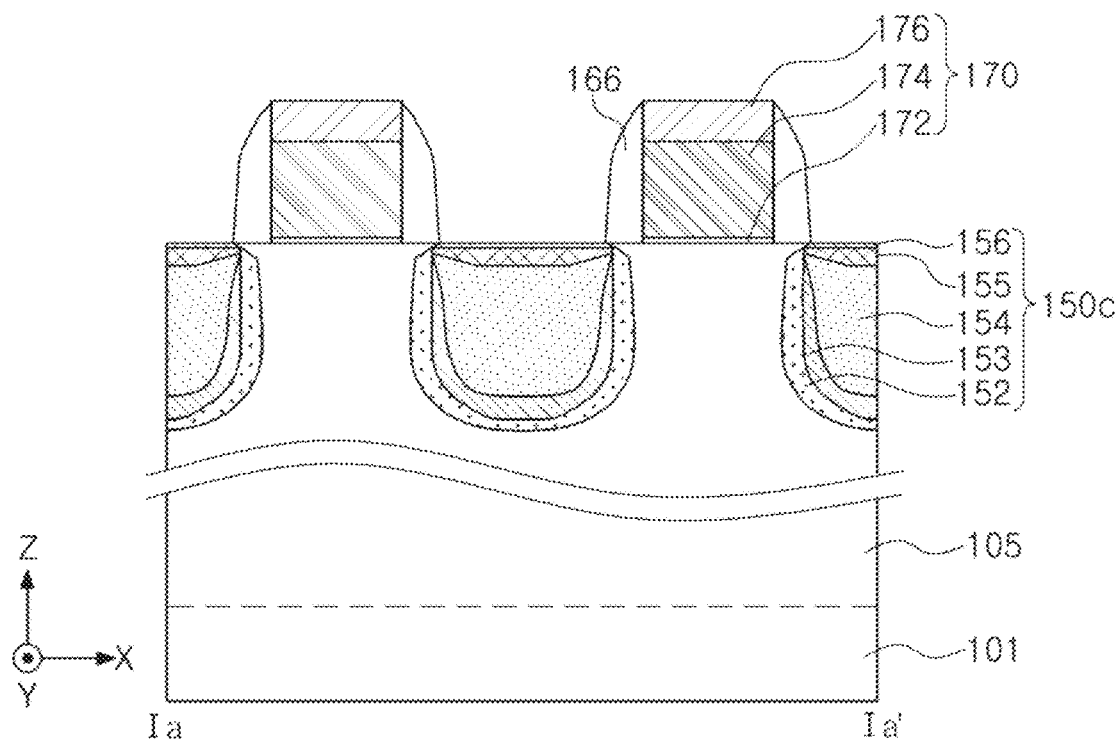

Referring to FIGS. 23A and 23B, second to fifth layers 153, 154, 155, and 156 are formed on the first layers 152, so source/drain regions 150c may be provided.

The second to fifth layers 153, 154, 155, and 156 may be provided using a process similar to that described above with reference to FIGS. 17A and 17B. Thus, the source/drain regions 150c, including the first to fifth layers 152, 153, 154, 155, and 156, may be provided.

Figure 24:
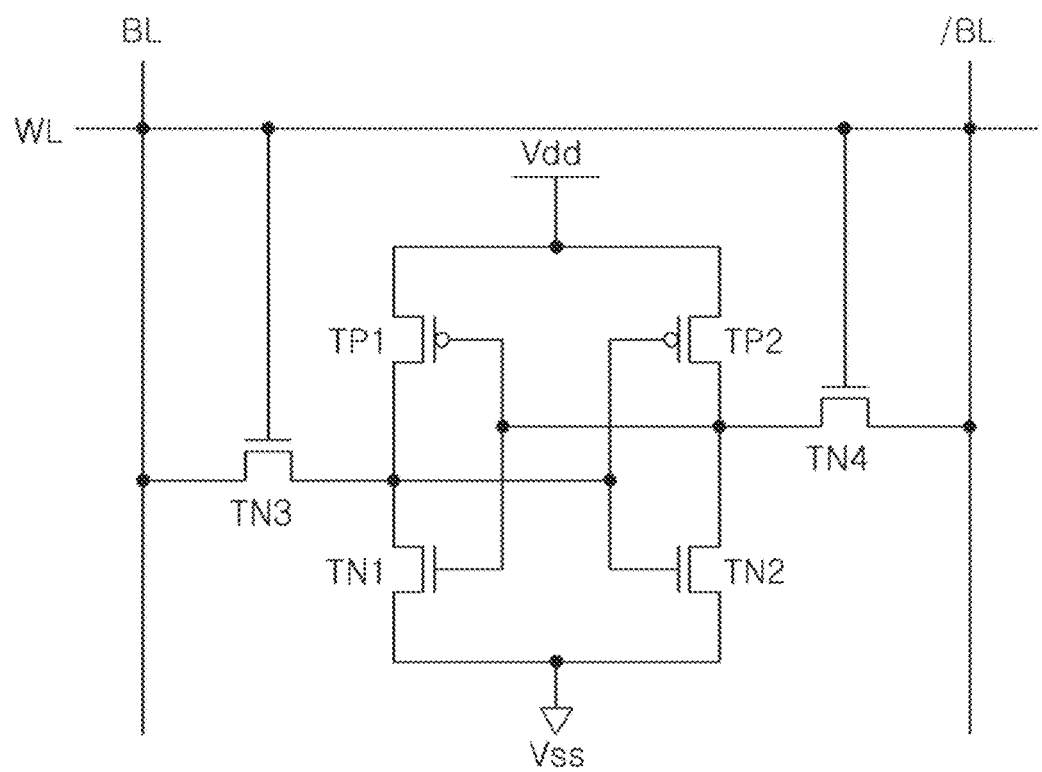
FIG. 24 is a circuit diagram of a SRAM cell including a semiconductor device according to example embodiments.

FIG. 24 is a circuit diagram of a SRAM cell including a semiconductor device according to example embodiments.

Referring to FIG. 24, in the SRAM element, a single cell may be formed of first and second driving transistors TN1 and TN2, first and second load transistors TP1 and TP2, as well as first and second access transistors TN3 and TN4. In this case, a source of the first and second driving transistors TN1 and TN2 may be connected to a ground voltage line Vss, while a source of the first and second load transistors TP1 and TP2 may be connected to a power supply voltage line Vdd.

The first driving transistor TN1, formed of an NMOS transistor, and the second load transistor TP1, formed of a PMOS transistor, may form a first inverter, while the second driving transistor TN2, formed of an NMOS transistor, and the second load transistor TP2, formed of a PMOS transistor, may form a second inverter. At least a portion of the first and second load transistors TP1 and TP2 may include a semiconductor device according to various example embodiments, as described above with reference to FIGS. 1 to 10B.

An output terminal of the first and second inverters may be connected to a source of the first access transistor TN3 and the second access transistor TN4. Moreover, the first and second inverters may be connected to each other to form a single latch circuit while an input terminal and an output terminal are crossed. In addition, drains of the first and second access transistors TN3 and TN4 may be connected to first and second bit lines BL and/BL.

Figure 25:
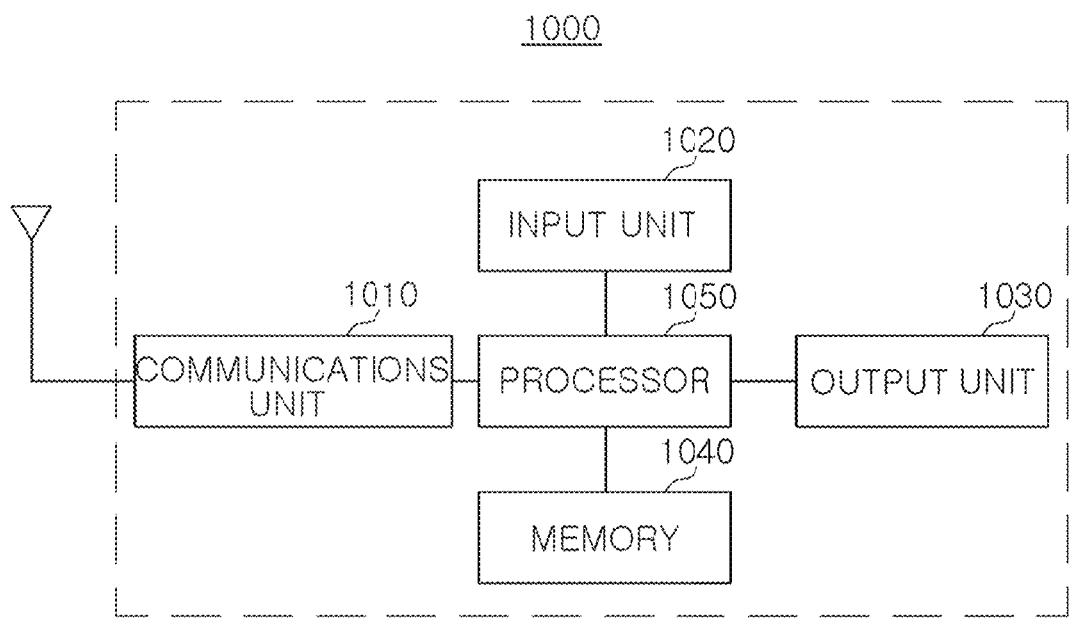
FIG. 25 is a block diagram illustrating an electronic device, including a semiconductor device, according to example embodiments.

FIG. 25 is a block diagram illustrating an electronic device, including a semiconductor device, according to example embodiments.

Referring to FIG. 25, an electronic device 1000 according to an example embodiment may include a communications unit 1010, an input unit 1020, an output unit 1030, a memory 1040, and a processor 1050.

The communications unit 1010 may include a wired/wireless communications module such as a wireless Internet module, a local communications module, a global positioning system (GPS) module, or a mobile communications module. The wired/wireless communications module included in the communications unit 1010 may be connected to an external communications network based on various communications standards to transmit and receive data.

The input unit 1020 may include a mechanical switch, a touchscreen, a voice recognition module, and the like, as a module provided for a user to control operations of the electronic device 1000. In addition, the input unit 1020 may also include a mouse or a finger mouse device operating based on a trackball or a laser pointer, and may further include various sensor modules which enable a user to input data.

The output unit 1030 may output information processed by the electronic device 1000 in an audio or video format, and the memory 1040 may store a program for processing or control of the processor 1050, or data. The output unit 1030 may include at least one of a speaker, an antenna, a connection structure (e.g., terminal, microUSB, etc.) and the like for outputting information to an electronic device. The processor 1050 may send an instruction to the memory 1040 depending on a required operation to store or retrieve data to/from the memory 1040.

The memory 1040 may be embedded in the electronic device 1000, or may communicate with the processor 1050 through an additional interface. When the memory 1040 communicates with the processor 1050 through the additional interface, the processor 1050 may store data in or retrieve data from the memory 1040 through various interface standards such as secure digital (SD), secure digital high capacity (SDHC), secure digital extended capacity (SDXC), micro SD, universal serial bus (USB), etc.

The processor 1050 controls operation of each component included in the electronic device 1000. The processor 1050 may perform control and processing associated with a voice call, a video call, data communications, and the like, or may conduct control and processing for multimedia reproduction and management. The processor 1050 may also process an input entered by a user through the input unit 1020 and output a result thereof through the output unit 1030. Furthermore, the processor 1050 may store or retrieve data required to control operations of the electronic device 1000 to/from the memory 1040 as described above. At least one of the processor 1050 and the memory 1040 may include a semiconductor device according to various example embodiments, as described above with reference to FIGS. 1 to 10B.

Figure 26:
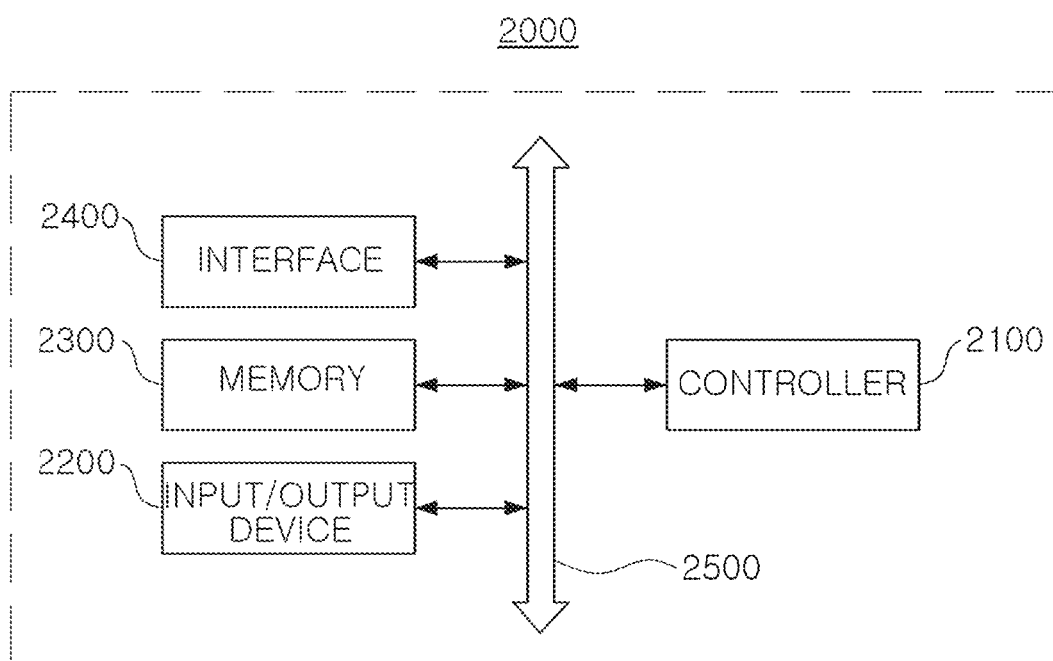
FIG. 26 is a schematic diagram of a system including a semiconductor device according to example embodiments.

FIG. 26 is a schematic diagram of a system including a semiconductor device according to example embodiments.

Referring to FIG. 26, a system 2000 may include a controller 2100, an input/output (I/O) device 2200, a memory 2300, and an interface 2400. The system 2000 may be a mobile system, or a system transmitting or receiving information. The mobile system may be a personal digital assistant (PDA), a portable computer, a tablet PC, a wireless phone, a mobile phone, a digital music player, a memory card, and the like.

The controller 2100 may function to execute a program and control the system 2000. The controller 2100 may be, for example, a microprocessor, a digital signal processor, a microcontroller, or devices similar thereto.

The I/O device 2200 may be used to input or output data of the system 2000. The system 2000 may use the I/O device 2200 to be connected to an external device, such as, a personal computer or a network, communicating data with the external device. The I/O device 2200 may be, for example, a keypad, a keyboard, or a display.

The memory 2300 may store a code and/or data for operations of the controller 2100, and/or may store data processed by the controller 2100.

The interface 2400 may be a data transfer path between the system 2000 and other external devices. The controller 2100, the I/O device 2200, the memory 2300, and the interface 2400 may communicate with each other using a bus 2500.

At least one of the controller 2100 or the memory 2300 may include a semiconductor device according to various example embodiments, as described above with reference to FIGS. 1 to 10B.

As set forth above, according to example embodiments of inventive concepts, a structure and a shape of a source/drain region are controlled, so a semiconductor device having improved electrical characteristics may be provided.

While example embodiments have been shown and described above, it will be apparent to those skilled in the art that modifications and variations could be made without departing from the scope of the present disclosure, as defined by the appended claims.

What is claimed is:
1. A semiconductor device, comprising:
a substrate;
an active fin on the substrate, the active fin extending in a first direction, the active fin including a recess region;
a gate electrode on the substrate, the gate electrode intersecting the active fin such that the recess region of the active fin is adjacent to at least one side of the gate electrode, the gate electrode extending in a second direction; and a source/drain region in the recess region of the active fin, the source/drain region including a base layer in contact with the active fin and a first layer on the base layer, the base layer including an inner end and an outer end opposing each other in the first direction, the base layer on an inner sidewall of the recess region, the base layer and the first layer having different concentrations of germanium (Ge), the outer end of the base layer being in contact with the first layer, and the outer end of the base layer having a shape convex outwardly toward outside of the gate electrode on a plane parallel to an upper surface of the substrate, wherein the base layer includes boron (B) or gallium (Ga) having a concentration higher than a concentration of boron (B) or gallium (Ga) in the active fin, wherein the outer end of the base layer is in the recess region of the active fin.

2. The semiconductor device of claim 1, wherein the base layer has a thickness in a range of about 3 nm to about 5 nm.

3. The semiconductor device of claim 1, wherein the source/drain region has a first width in the second direction and a second width in the second direction, the first width is in a region adjacent to the gate electrode, the second width is in a region spaced apart from the gate electrode, and the second width is greater than the first width.

4. The semiconductor device of claim 1, wherein the first layer includes germanium (Ge) having a concentration higher than a concentration of germanium (Ge) in the base layer.

5. The semiconductor device of claim 1, wherein at least a portion of the inner end of the base layer is below the gate electrode.

6. The semiconductor device of claim 1, wherein the first layer has an inner end and an outer end opposing each other in the first direction on the inner sidewall of the recess region, and the outer end of the first layer has a region convex outwardly of the gate electrode on a plane.

7. The semiconductor device of claim 1, wherein the base layer is formed of silicon (Si).

8. The semiconductor device of claim 1, wherein the outer end of the base layer is not defined by a crystal plane of the active fin.

9. The semiconductor device of claim 1, wherein the first layer is a silicon germanium (SiGe) layer including germanium (Ge) in a range of 20 at. % to 40 at. %.

10. The semiconductor device of claim 1, wherein the source/drain region further includes a second layer on the first layer, the second layer fills the recess region, and the second layer includes germanium (Ge) having a concentration higher than a concentration of germanium (Ge) in the first layer.

11. The semiconductor device of claim 1, wherein the inner end of the base layer includes a region extending perpendicularly to an upper surface of the substrate.

12. The semiconductor device of claim 1, wherein the base layer includes germanium (Ge) having a concentration higher than a concentration of germanium (Ge) in the active fin.

13. A semiconductor device, comprising:

a substrate;

an active fin on the substrate, the active fin extending in a first direction on the substrate;

a gate electrode on the substrate, the gate electrode extending in a second direction and intersecting the active fin; and a source/drain region on the active fin, the source/drain region including a first layer and a second layer having different concentrations of germanium (Ge), an end portion of the first layer, in which the first layer is in contact with the second layer, having a region convex toward outside of the gate electrode on a plane parallel to an upper surface of the substrate, wherein the end portion of the first layer is in a recess region of the active fin, wherein the source/drain region has a first width in the second direction and a second width in the second direction, the first width is in a region adjacent to the gate electrode, the second width is in a region spaced apart from the gate electrode, and the second width is greater than the first width.

14. The semiconductor device of claim 13, further comprising:

a base layer below the first layer, wherein the base layer contacts the active fin, and the base layer includes germanium (Ge) having a concentration lower than a concentration of germanium (Ge) included in the first layer.

15. The semiconductor device of claim 14, wherein an end portion of the base layer, in which the base layer is in contact with the active fin, has a region concave toward outside of the gate electrode on a plane.

16. The semiconductor device of claim 13, further comprising:

a contact plug on the source/drain region, wherein the contact plug is connected to the source/drain region.

17. The semiconductor device of claim 13, wherein the substrate includes a Silicon-On-Insulator (SOI) layer.

18. A semiconductor device, comprising:

a substrate including a Silicon-On-Insulator (SOI) layer;

an active fin on the substrate, the active fin extending in one direction on the substrate;

a gate electrode on the substrate, the gate electrode extending and intersecting the active fin; and an epitaxial layer on the active fin at least one side of the gate electrode, wherein an end portion of the epitaxial layer is in a recess region of the active fin, and at least one of, an end portion of the active fin, in contact with the epitaxial layer, or the end portion of the epitaxial layer, has a region convex toward outside of the gate electrode on a plane parallel to an upper surface of the substrate.

19. The semiconductor device of claim 18, further comprising:

a first layer and a second layer on the epitaxial layer, wherein the first layer and the second layer have different concentrations of germanium (Ge), and the epitaxial layer, the first layer, and the second layer form a source/drain region.

20. The semiconductor device of claim 19, wherein the epitaxial layer includes germanium (Ge) having a concentration lower than a concentration of germanium (Ge) in the first layer.

\* \* \* \* \*